(12) United States Patent
Nishi et al.

(10) Patent No.: US 7,492,028 B2
(45) Date of Patent: Feb. 17, 2009

(54) PHOTOELECTRIC CONVERSION DEVICE AND MANUFACTURING METHOD OF THE SAME, AND A SEMICONDUCTOR DEVICE

(75) Inventors: Kazuo Nishi, Yamanashi (JP); Yuusuke Sugawara, Yamanashi (JP); Hironobu Takahashi, Yamanashi (JP); Tatsuya Arao, Kanagawa (JP)

(73) Assignee: Semiconductor Energy Laboratory Co., Ltd., Atsugi-Shi, Kanagawa-Ken (JP)

( * ) Notice: Subject to any disclaimer, the term of this patent is extended or adjusted under 35 U.S.C. 154(b) by 104 days.

(21) Appl. No.: 11/276,036

(22) Filed: Feb. 10, 2006

(65) Prior Publication Data

US 2006/0186497 A1 Aug. 24, 2006

(30) Foreign Application Priority Data

Feb. 18, 2005 (JP) .............................. 2005-042926
Apr. 19, 2005 (JP) .............................. 2005-121392

(51) Int. Cl.
*H01L 27/14* (2006.01)

(52) U.S. Cl. ...................... 257/458; 257/428; 257/431; 257/E33.046; 257/E31.126

(58) Field of Classification Search ................. 257/428, 257/431, 458, E33.046, E31.061, E31.124, 257/E31.126

See application file for complete search history.

(56) References Cited

U.S. PATENT DOCUMENTS

| | | | |
|---|---|---|---|
| 4,937,129 A | 6/1990 | Yamazaki | |
| 5,017,987 A * | 5/1991 | Nanjoh et al. | 257/432 |
| 5,035,753 A | 7/1991 | Suzuki et al. | |
| 5,212,395 A * | 5/1993 | Berger et al. | 257/185 |
| 5,216,491 A * | 6/1993 | Yamamoto et al. | 257/53 |
| 5,458,695 A | 10/1995 | Arai et al. | |
| 5,525,813 A * | 6/1996 | Miyake et al. | 257/59 |
| 5,572,255 A | 11/1996 | Murakami et al. | |
| 6,188,380 B1 | 2/2001 | Kawashima et al. | |
| 6,353,228 B1 * | 3/2002 | Itabashi | 250/370.11 |

(Continued)

FOREIGN PATENT DOCUMENTS

CN 1034074 7/1989

(Continued)

OTHER PUBLICATIONS

Chinese Office Action, Patent Application No. 200610009063.9, dated Dec. 12, 2008, (19 pages) (English translation).

*Primary Examiner*—Richard Elms
*Assistant Examiner*—Allison P Bernstein
(74) *Attorney, Agent, or Firm*—Fish & Richardson P.C.

(57) ABSTRACT

A photo-sensor having a structure which can suppress electrostatic discharge damage is provided. Conventionally, a transparent electrode has been formed over the entire surface of a light receiving region; however, in the present invention, the transparent electrode is not formed, and a p-type semiconductor layer and an n-type semiconductor layer of a photoelectric conversion layer are used as an electrode. Therefore, in the photo-sensor according to the present invention, resistance is increased an electrostatic discharge damage can be suppressed. In addition, positions of the p-type semiconductor layer and the n-type semiconductor layer, which serve as an electrode, are kept away; and thus, resistance is increased and withstand voltage can be improved.

23 Claims, 21 Drawing Sheets

U.S. PATENT DOCUMENTS

| | | |
|---|---|---|
| 2003/0082889 A1 | 5/2003 | Maruyama et al. |
| 2004/0085598 A1* | 5/2004 | Kokeguchi et al. ....... 358/909.1 |
| 2004/0183072 A1 | 9/2004 | Kim et al. |
| 2006/0097259 A1 | 5/2006 | Suezaki et al. |

FOREIGN PATENT DOCUMENTS

| | | |
|---|---|---|
| CN | 1098804 | 2/1995 |
| CN | 1417841 | 5/2003 |
| CN | 1530725 | 9/2004 |
| EP | 0324550 | 7/1989 |
| EP | 0619676 | 10/1994 |
| EP | 0 861 017 A2 | 8/1998 |
| EP | 1458030 | 9/2004 |
| EP | 1635402 | 3/2006 |
| JP | 56-080176 | 7/1981 |
| JP | 58-063179 | 4/1983 |
| JP | 02-177374 | 7/1990 |
| JP | 3171808 | 3/2001 |
| JP | 3193315 | 5/2001 |
| JP | 3310370 | 5/2002 |
| JP | 2003-047017 | 2/2003 |
| JP | 2003-060744 | 2/2003 |
| JP | 2004-363279 | 12/2004 |
| WO | 2004/114417 | 12/2004 |

* cited by examiner

PHOTOELECTRIC CONVERSION DEVICE AND MANUFACTURING METHOD OF THE SAME, AND A SEMICONDUCTOR DEVICE

BACKGROUND OF THE INVENTION

1. Field of the Invention

The present invention relates to a photoelectric conversion device, more particularly, a photoelectric conversion device which is formed by using a thin film semiconductor element and a method for manufacturing the photoelectric conversion device. In addition, the present invention relates to an electronic device using a photoelectric conversion device.

2. Description of the Related Art

A number of photoelectric conversion devices generally used for detecting an electromagnetic wave are known, and for example, a photoelectric conversion device having sensitivity in ultra-violet rays to infrared rays are referred to as a photo-sensor in general. A photo-sensor having sensitivity in a visible radiation region with a wave length of 400 nm to 700 nm is particularly referred to as a photo-sensor for visible light, and a number of photo-sensors for visible light are used for devices which need an illuminance adjustment or on/off control depending on a human living environment. In particular, in a display device, brightness in the periphery of the display device is detected to adjust display luminance. It is because unnecessary electric-power can be reduced by detecting peripheral brightness and obtaining appropriate display luminance. Specifically, such a photo-sensor for adjusting luminance is used for a cellular phone or a personal computer (for example, refer to the Patent Document 1).

In addition, as well as peripheral brightness, luminance of back light of a display device, particularly, a liquid crystal display device is also detected by a photo-sensor to adjust luminance of a display screen (for example, refer to the Patent Documents 2 and 3).

Further, in a display device using a projector, the convergence adjustment is conducted by using a photo-sensor. The convergence adjustment is to adjust an image so that an image of each color of RGB does not generate discrepancy. By using a photo-sensor, a location of an image of each color is detected, and the image is arranged in the right location (for example, refer to the Patent Document 4).

FIG. 6 shows a structure of a photo-sensor that has been used conventionally. In FIG. 6, a first transparent electrode 1002 is formed over a substrate 1001, and a p-type semiconductor layer 1003, an intrinsic semiconductor layer 1004 and an n-type semiconductor layer 1005, which serve as a photoelectric conversion layer, are formed over the first transparent electrode 1002. Further, a second transparent electrode 1006 is formed over the n-type semiconductor layer 1005. Then, a discrete insulating layer 1007 is formed to cover the transparent electrodes 1002 and 1006, and contact holes are formed in the discrete insulating layer 1007. Moreover, a first extraction electrode 1008 connected to the first transparent electrode 1002 and a second extraction electrode 1009 connected to the second transparent electrode 1006 are formed.

In the photo-sensor shown in FIG. 6, since the transparent electrodes 1002 and 1006 are formed, there is a problem that resistance is lowered, static electricity is discharged faster, and electrostatic discharge damage is likely to be caused. In addition, an electric field is concentrated on end portions of the p-type semiconductor layer 1003, the intrinsic semiconductor layer 1004 and the n-type semiconductor layer 1005, which are the photoelectric conversion layer, so that there is a concern that electrostatic discharge damage is more likely to be caused.

Further, since the transparent electrode 1006 is formed over the entire surface of the n-type semiconductor layer 1005 which is an upper layer of the photoelectric conversion layer, and the transparent electrode 1006 is formed over the entire surface of the p-type semiconductor layer 1003 which is a lower layer of the photoelectric conversion layer, intensity of light that is incident to the photoelectric conversion layer can be decreased.

[Patent Document 1]  Japanese Patent Laid-Open No. 2003-60744
[Patent Document 2]  Japanese Patent No. 3171808
[Patent Document 3]  Japanese Patent No. 3193315
[Patent Document 4]  Japanese Patent Laid-Open No. 2003-47017

SUMMARY OF THE INVENTION

In view of the foregoing problems, it is an object of the present invention to provide a photo-sensor having a structure which can suppress electrostatic discharge damage.

In the present invention, in order to solve the foregoing problems, one feature of the invention is that a transparent electrode overlapping with the entire surface of a light receiving region is not formed. Further, in the present invention, a p-type semiconductor layer of a photoelectric conversion layer is used as one electrode, and an n-type semiconductor layer is used as the other electrode. When the p-type semiconductor layer and the n-type semiconductor layer are used as an electrode, resistance is increased and electrostatic discharge damage can be suppressed.

In addition, positions of the p-type semiconductor layer and the n-type semiconductor layer, which serve as an electrode, are kept away; and thus, resistance is increased and the ability of the photo-sensor to withstand voltage can be improved.

The present invention relates to a photoelectric conversion device including, over a substrate, a photoelectric conversion layer having a first semiconductor layer of one conductivity type, a second semiconductor layer, and a third semiconductor layer of an inverse conductivity type to the conductivity type of the first semiconductor layer; a first electrode that comes in contact with the first semiconductor layer through an opening formed in the photoelectric conversion layer; an insulating layer formed so as to come in contact with the third semiconductor layer of the photoelectric conversion layer and provided with an opening, which exposes the third semiconductor layer; and a second electrode that comes in contact with the third semiconductor layer through the opening formed in the insulating layer; where the third semiconductor layer is removed in a region that is not covered with the first electrode, the insulating layer, and the second electrode of the photoelectric conversion layer.

In addition, the present invention relates to a method for manufacturing a photoelectric conversion device. The method for manufacturing a photoelectric conversion device includes the steps of, over a substrate, forming a photoelectric conversion layer having a first semiconductor layer of one conductivity type, a second semiconductor layer, and a third semiconductor layer of an inverse conductivity type to the conductivity type of the first semiconductor layer; forming a first insulating layer having a first opening over the photoelectric conversion layer; forming a second opening in the photoelectric conversion layer; forming a first electrode layer that comes in contact with the first semiconductor layer through the second opening; and forming a second electrode layer that comes in contact with the third semiconductor layer of the photoelectric conversion layer through the first opening; where the third semiconductor layer is removed in a region that is not covered with the first electrode, the insulating layer, and the second electrode.

The present invention relates to a semiconductor device including, over a substrate, a photoelectric conversion element and a circuit for signal processing of the output value of the photoelectric conversion element. The photoelectric conversion element includes a photoelectric conversion layer having a first semiconductor layer of one conductivity type, a second semiconductor layer, and a third semiconductor layer of an inverse conductivity type to the conductivity type of the first semiconductor layer; a first electrode that comes in contact with the first semiconductor layer through an opening formed in the photoelectric conversion layer; an insulating layer formed so as to come in contact with the third semiconductor layer of the photoelectric conversion layer and provided with an opening, which exposes the third semiconductor layer; and a second electrode that comes in contact with the third semiconductor layer through the opening formed in the insulating layer; where the third semiconductor layer is removed in a region that is not covered with the first electrode, the insulating layer, and the second electrode of the photoelectric conversion layer. The circuit includes a plurality of thin film transistors, and each of the plurality of thin film transistors has an island-like semiconductor region including a source region, a drain region, and a channel formation region; a gate insulating film; a gate electrode; a source electrode electrically connected to the source region; and a drain electrode electrically connected to the drain region.

The circuit is an amplifier circuit to amplify the output value of the photoelectric conversion element.

The present invention relates to a photoelectric conversion device including, over a substrate, a first electrode; a photoelectric conversion layer having a first semiconductor film of one conductivity type, a second semiconductor film, and a third semiconductor film of an inverse conductivity type to the conductivity type of the first semiconductor film; an insulating film covering the first electrode and the photoelectric conversion layer; a second electrode that is formed over the insulating film and comes in contact with a part of the first electrode; and a third electrode that is formed over the insulating film and comes in contact with a part of the third semiconductor film; where the photoelectric conversion layer overlaps and contacts with a part of the first electrode.

In the present invention, the first electrode is a transparent electrode.

In the present invention, the transparent electrode includes any of an indium oxide-tin oxide alloy containing silicon, zinc oxide, tin oxide, indium oxide, or an indium oxide-zinc oxide alloy formed by using a target in which indium oxide is mixed with 2 wt % or more to 20 wt % or less of zinc oxide.

In the present invention, the first electrode is a light-shielding conductive film.

In the present invention, the light-shielding conductive film includes any of a single-layer film composed of an element selected from titanium, tungsten, tantalum, molybdenum, neodymium, cobalt, zirconium, zinc, ruthenium, rhodium, palladium, osmium, iridium, platinum, aluminum, gold, silver or copper, or an alloy material or a compound material containing the element as a main component; or a single-layer film composed of nitride thereof such as titanium nitride, tungsten nitride, tantalum nitride or molybdenum nitride.

In the present invention, after the third semiconductor layer is removed, a second insulating film having openings is formed, and through the openings, a first extraction electrode and a second extraction electrode, which are connected to the first electrode layer and the second electrode layer respectively, are formed.

In the present invention, a conductive film is formed between the substrate and the first semiconductor layer.

In the present invention, the conductive film is a transparent conductive film.

In the present invention, a color filter is formed between the substrate and the first semiconductor layer.

In the present invention, each of the source electrode and the drain electrode is a stacked film.

In the present invention, the stacked film is formed by stacking a titanium (Ti) film, an aluminum (Al) film containing the small amount of silicon (Si), and a titanium (Ti) film.

In the present invention, each of the source electrode and the drain electrode is a single-layer film.

In the present invention, the single-layer film is a single-layer film composed of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir) or platinum (Pt), or an alloy material or a compound material containing the element as a main component; or a single-layer film composed of nitride thereof such as titanium nitride, tungsten nitride, tantalum nitride or molybdenum nitride.

The present invention relates to a photoelectric conversion device including, over a substrate, a first electrode; a photoelectric conversion layer having a first semiconductor film of one conductivity type, a second semiconductor film, and a third semiconductor film of an inverse conductivity type to the conductivity type of the first semiconductor film; an insulating film covering the first electrode and the photoelectric conversion layer; a second electrode that is formed over the insulating film and comes in contact with a part of the first electrode; and a third electrode that is formed over the insulating film and comes in contact with a part of the third semiconductor film; where the photoelectric conversion layer overlaps and contacts with a part of the first electrode.

In the present invention, the first electrode is a transparent electrode.

In the present invention, the transparent electrode includes any of an indium oxide-tin oxide alloy containing silicon, zinc oxide, tin oxide, indium oxide, or an indium oxide-zinc oxide alloy formed by using a target in which indium oxide is mixed with 2 wt % or more to 20 wt % or less of zinc oxide.

In the present invention, the first electrode is a light-shielding conductive film.

In the present invention, the light-shielding conductive film includes any of a single-layer film composed of an element selected from titanium, tungsten, tantalum, molybdenum, neodymium, cobalt, zirconium, zinc, ruthenium, rhodium, palladium, osmium, iridium, platinum, aluminum, gold, silver or copper, or an alloy material or a compound material containing the element as a main component; or a single-layer film composed of nitride thereof such as titanium nitride, tungsten nitride, tantalum nitride or molybdenum nitride.

In the present invention, the substrate is a flexible substrate.

In the present invention, the substrate is a glass substrate.

In the present invention, the flexible substrate is one of a polyethylenenaphthalate (PEN) film, a polyethylene terephthalate (PET) film, and a polybutylene naphthalate (PBN) film.

In accordance with the present invention, a photo-sensor in which electrostatic discharge damage is suppressed can be manufactured. In addition, reliability of an electronic device in which such a photo-sensor is incorporated can be enhanced.

Moreover, in a photo-sensor manufactured in accordance with the present invention, a wavelength of absorbed light can be closer to sensitivity of human eyes.

These and other objects, features and advantages of the present invention will become more apparent upon reading of the following detailed description along with the accompanied drawings.

DESCRIPTION OF THE INVENTION

Embodiment

The present embodiment will be described with reference to FIGS. 1A to 1B, 2A to 2C, and 3A to 3C.

First, over a substrate 101, a p-type semi-amorphous semiconductor film is formed, for example, as a p-type semiconductor film 102. In the present embodiment, a flexible substrate is used as the substrate 101, and specifically, a film of polyethylenenaphthalate (PEN) is used. In addition to polyethylenenaphthalate, a film of polyethylene terephthalate (PET), polybutylene naphthalate (PBN) and the like may be used. Further, a glass substrate may also be used.

As the p-type semiconductor film 102, a semi-amorphous silicon film containing an impurity element that belongs to Group 13 of the periodic table such as boron (B) is formed by plasma CVD.

A semi-amorphous semiconductor film includes a semiconductor that has an intermediate structure between an amorphous semiconductor and a semiconductor having a crystal structure (including a single crystal and a polycrystal). The semi-amorphous semiconductor has a third condition that is stable in terms of free energy, and it is a crystalline substance including a short range order and lattice distortion, the crystal grain size of which can be 0.5 to 20 nm dispersed in a non-single crystal semiconductor film. In the semi-amorphous semiconductor film, Raman spectrum is shifted to a wave number side lower than 520 cm$^{-1}$, and diffraction peaks of (111) and (220) that are said to be caused by a crystal lattice of Si are observed in X-ray diffraction. In addition, at least 1 atomic % or more of hydrogen or halogen is contained to terminate a dangling bond. In the present specification, the semiconductor film as described above is referred to as a semi-amorphous semiconductor (SAS) film for convenience. Moreover, a noble gas element such as helium, argon, krypton, or neon is contained to further promote lattice distortion so that stability is enhanced and a favorable semi-amorphous semiconductor film is obtained.

It is to be noted that a semi-amorphous semiconductor film also includes a micro-crystalline semiconductor film (a microcrystal semiconductor film). The SAS film can be obtained by glow discharge decomposition of a gas containing silicon. SiH$_4$ is used as a typical gas containing silicon, and in addition, Si$_2$H$_6$, SiH$_2$Cl$_2$, SiHCl$_3$, SiCl$_4$, SiF$_4$, or the like can also be used. The gas containing silicon may be diluted with hydrogen, or a gas in which one or more of noble gas elements of helium, argon, krypton and neon are added to hydrogen to easily form the SAS film. It is preferable that the gas containing silicon be diluted in a 2-fold to 1000-fold dilution factor range. Furthermore, a carbide gas such as CH$_4$ or C$_2$H$_6$, a germanic gas such as GeH$_4$ or GeF$_4$, F$_2$ or the like may be mixed in the gas containing silicon to adjust an energy band width to be 1.5 to 2.4 eV or 0.9 to 1.1 eV.

Figure 1A:
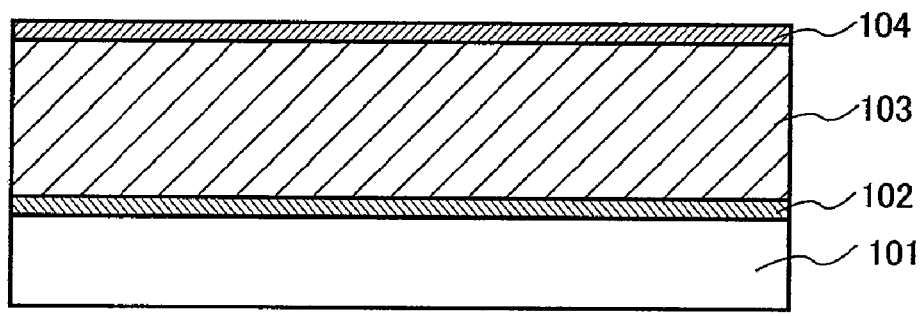
FIGS. 1A and 1B are views illustrating a manufacturing step of a photo-sensor according to the present invention.

After the p-type semiconductor film 102 is formed, a semiconductor film 103 which does not include an impurity imparting a conductivity type (intrinsic semiconductor film) and an n-type semiconductor film 104 are formed sequentially (FIG. 1A). Accordingly, a photoelectric conversion layer including the p-type semiconductor film 102, the intrinsic semiconductor film (also referred to as an i-type semiconductor film) 103 and the n-type semiconductor film 104 is formed.

As the intrinsic semiconductor film 103, for example, a semi-amorphous silicon film may be formed by plasma CVD. In addition, as the n-type semiconductor film 104, a semi-amorphous silicon film containing an impurity element that belongs to Group 15 of the periodic table such as phosphorus (P) may be formed, or an impurity element that belongs to Group 15 of the periodic table may be introduced after forming a semi-amorphous silicon film. It is to be noted that the amount of an impurity is controlled so that conductivity of the p-type semi-amorphous semiconductor film 102 and the n-type semi-amorphous semiconductor film 104 is 1 S/cm.

In addition, not only a semi-amorphous semiconductor film but also an amorphous semiconductor film may be used for the p-type semiconductor film 102, the intrinsic semiconductor film 103 and the n-type semiconductor film 104.

In the present embodiment, the p-type semiconductor film, the intrinsic semiconductor film and the n-type semiconductor film are stacked in this order. However, the p-type semiconductor film and the n-type semiconductor film may be stacked in the reverse order, namely, the n-type semiconductor film, the intrinsic semiconductor film and the p-type semiconductor film are stacked in this order.

Figure 1B:
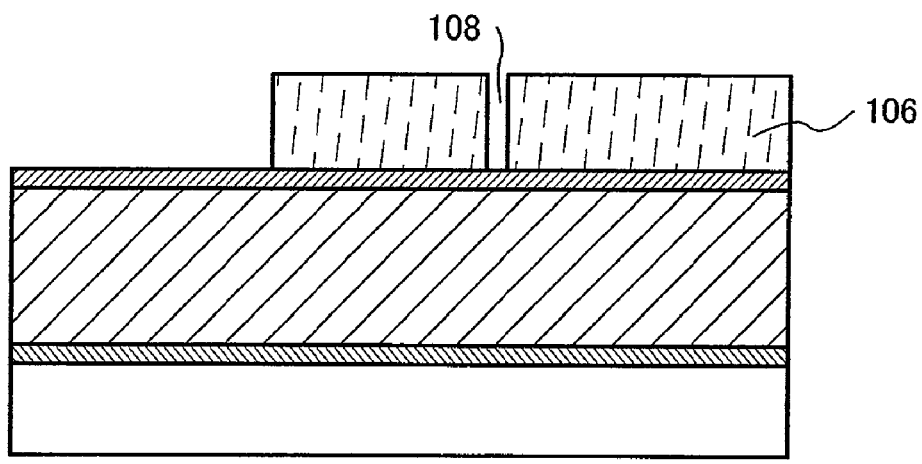

Subsequently, an insulating film 106 having a groove 108 is formed by screen printing or the like over the n-type semiconductor film 104 (FIG. 1B). The groove 108 contacts with the n-type semiconductor film 104. Then, a groove 107 is formed in the insulating film 106, the n-type semiconductor film 104, the intrinsic semiconductor film 103 and the p-type semiconductor film 102 by laser scribing (FIG. 2 A). The groove 107 is formed in the p-type semiconductor film 102, the intrinsic semiconductor film 103 and the n-type semiconductor film 104, and contacts with the p-type semiconductor film 102. In addition, the width of the groove 107 is 50 μm to 300 μm.

Figure 2A:
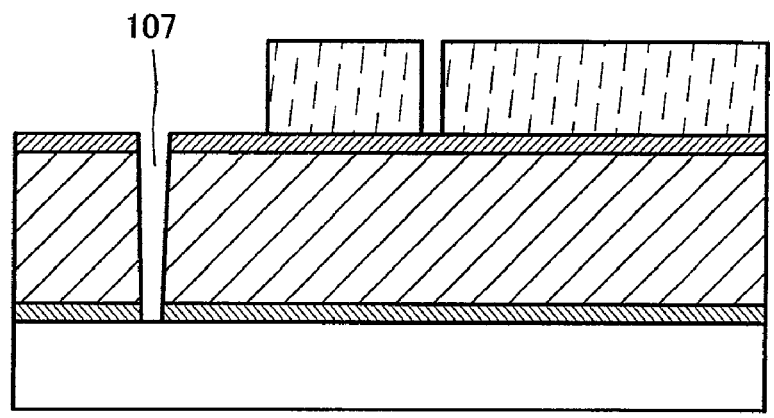
FIGS. 2A to 2C are views illustrating a manufacturing step of a photo-sensor according to the present invention.
Figure 2B:
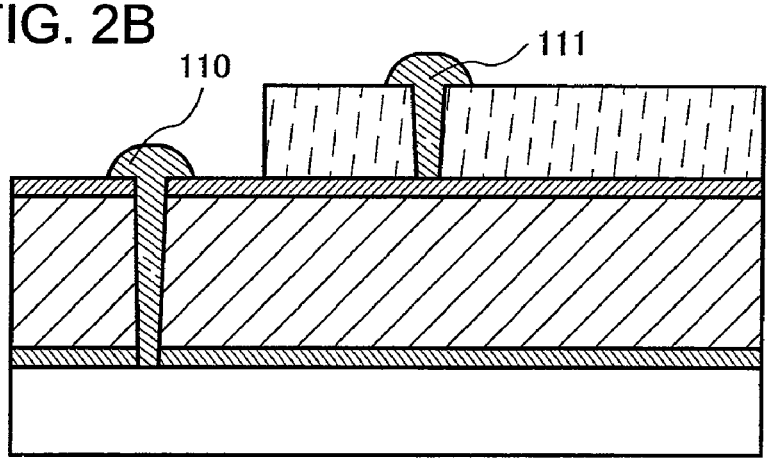

After the groove 107 is formed, electrode layers 110 and 111 are formed with a conductive paste by ink jet (FIG. 2B). As the conductive paste, a conductive paste containing a metal material such as silver (Ag), gold (Au), copper (Cu) or nickel (Ni), or a conductive carbon paste can be used. In addition, the electrode layers 110 and 111 may be formed by screen printing.

Figure 2C:
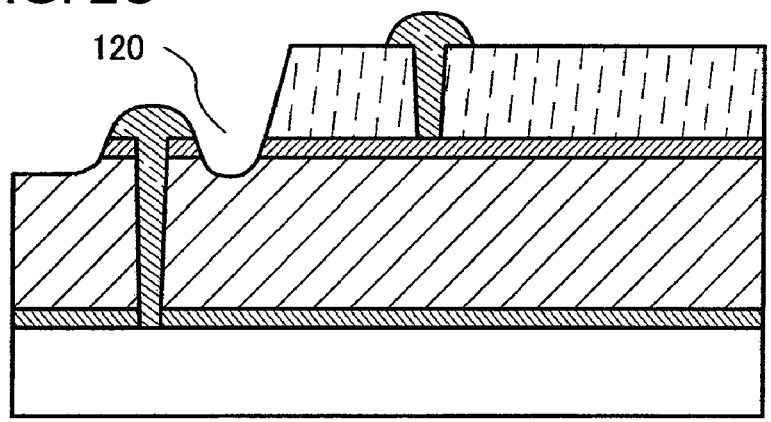

Then, etching is conducted by using the electrode layers 110 and 111 and the insulating film 106 as masks (FIG. 2C). By this etching, a part of the n-type semiconductor film 104, a part of the intrinsic semiconductor film 103, and a part of the insulating film 106 are etched to form an opening 120. This process removes the n-type semiconductor film 104, and a part of the intrinsic semiconductor film 103 is exposed. Therefore, the n-type semiconductor film 104 and the electrode layer 110 are electrically separated so that the electrode layers 110 and 111 are not short-circuited.

Figure 3A:
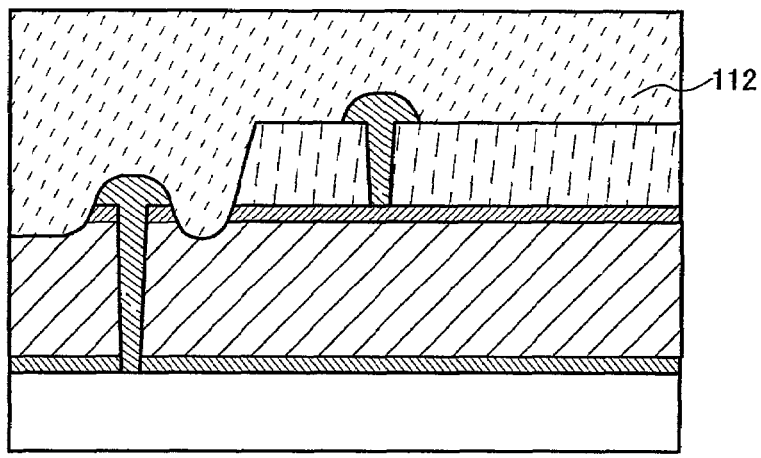
FIGS. 3A to 3C are views illustrating a manufacturing step of a photo-sensor according to the present invention.
Figure 3B:
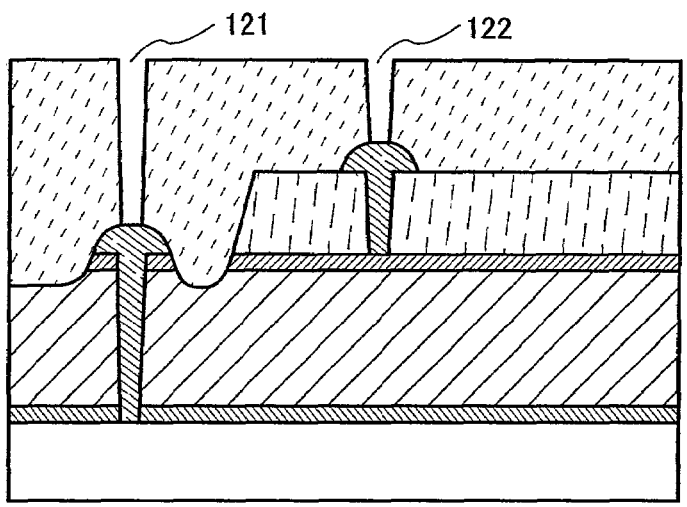
Figure 3C:
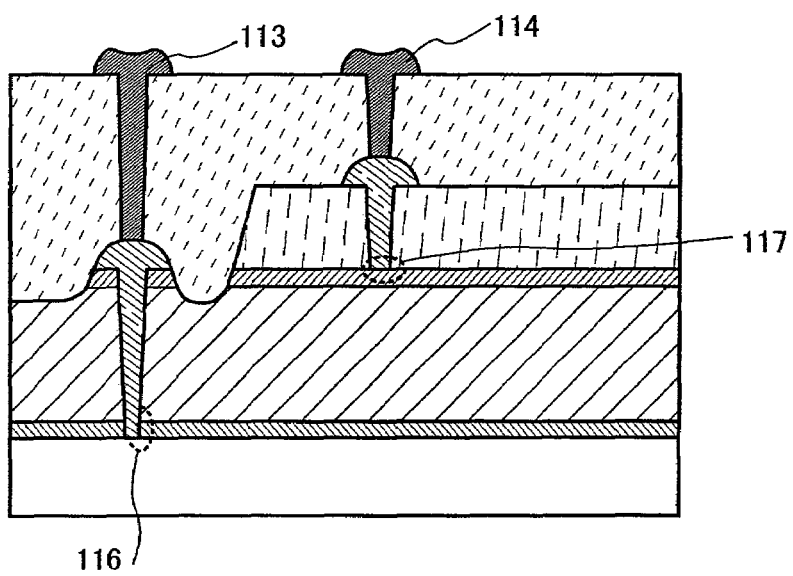

Subsequently, an insulating film 112 is formed to cover the electrode layers 110 and 111, the insulating film 106, the n-type semiconductor film 104, the intrinsic semiconductor film 103 that is exposed by the etching, and the p-type semiconductor film 102 (FIG. 3A). Further, grooves 121 and 122 are formed in the insulating film 112 by laser scribing again (FIG. 3B), and extraction electrodes 113 and 114 are formed with a conductive paste (FIG. 3C). The same material may be used for the conductive paste as in the case of forming the electrode layers 110 and 111.

As described above, one cell of a photo-sensor is formed. As for the photo-sensor manufactured in the present embodiment, it is not necessary to form a transparent electrode, since, among the p-type semiconductor film 102, the intrinsic semiconductor film 103 and the n-type semiconductor film 104 which are a photoelectric conversion layer, the p-type semiconductor film 102 and the n-type semiconductor film 104 substantially serve as an electrode.

In addition, in the photo-sensor according to the present invention, a region 116 where the electrode layer 110 contacts with the p-type semiconductor film 102 and a region 117 where the electrode layer 111 contacts with the n-type semiconductor film 104 can be kept away in terms of a distance. An electric current flows through the extraction electrode 113, the electrode layer 110, the p-type semiconductor film 102, the intrinsic semiconductor film 103, the n-type semiconductor film 104, the electrode layer 111 and the extraction electrode 114. As described above, since the region where the electrode layer 110 contacts with the p-type semiconductor film 102 and the region where the electrode layer 111 contacts with the n-type semiconductor film 104 are kept away in terms of a position so that an electric field is not concentrated, and withstand voltage withstand voltage to electrostatic discharge damage can be improved.

Figure 12:
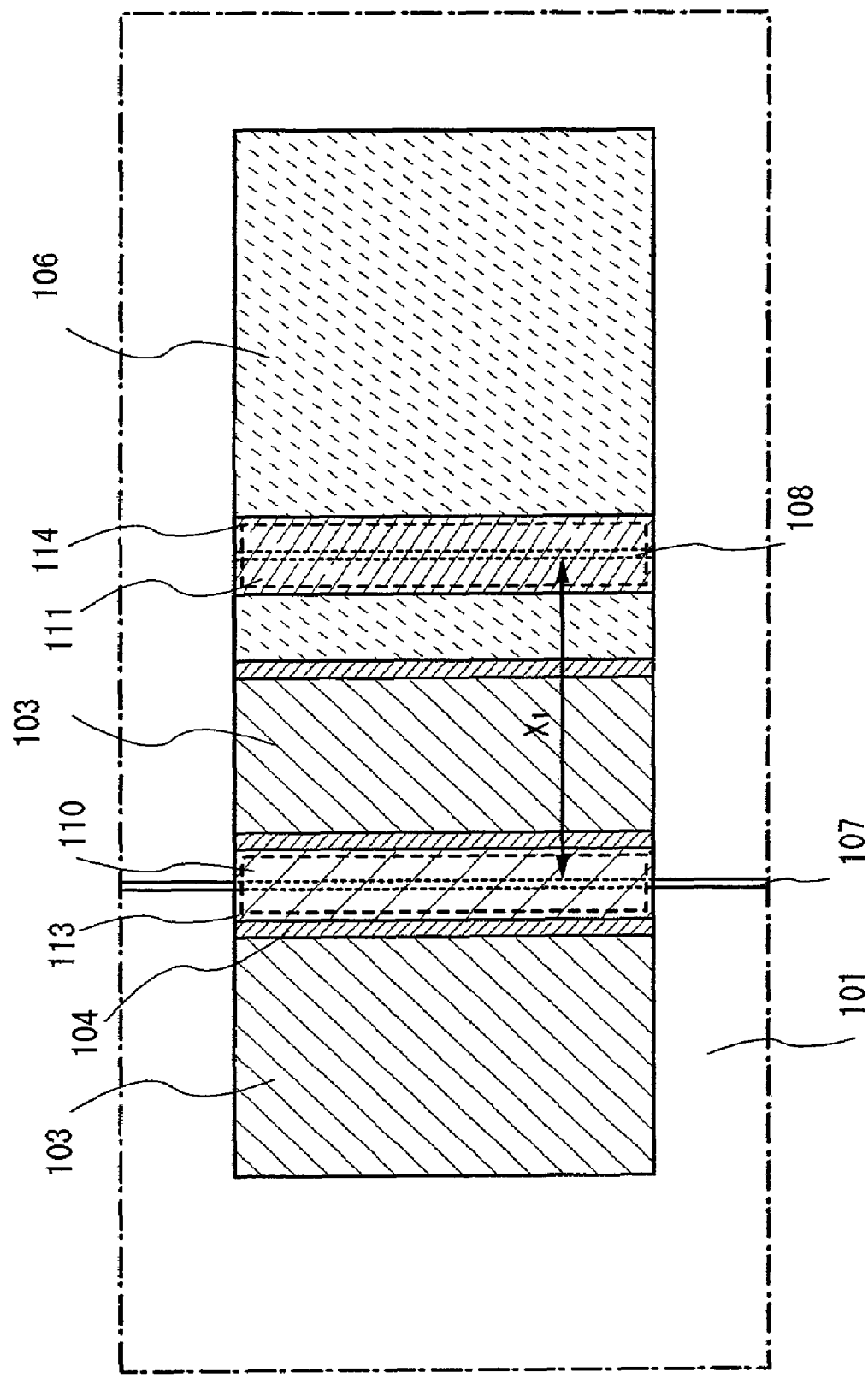
FIG. 12 is a top view of a photo-sensor according to the present invention.

FIG. 12 is a top view of the photo-sensor of FIG. 3C. It is to be noted that the insulating film 112 is not illustrated. When a distance between the electrode layers 110 and 111 is referred to as $X_1$ (μm), resistance increases when $X_1$ is large. Therefore, it is necessary to determine X1 in view of the resistance value of a whole element and its ability to withstand voltage that leads to electrostatic discharge damage. In other words, when $X_1$ is too small, resistance is lowered, and its ability to withstand voltage and, therefore, electrostatic discharge damage is also lowered. On the other hand, when X1 is too large, resistance of the whole element increases too much, and it does not function as an element.

In accordance with the present invention, a photo-sensor in which electrostatic discharge damage is suppressed can be manufactured; and thus, a high reliable product in which such a photo-sensor is incorporated can be obtained.

In addition, a semiconductor film used for a photoelectric conversion layer can be used to serve as an electrode; and thus, a thickness of a photo-sensor can be thinner than a conventional one.

Further, a transparent electrode that has been formed conventionally is not formed, and a semiconductor film used for a photoelectric conversion layer is used to serve as an electrode; and thus, a wavelength of light that is absorbed by the photo-sensor according to the present invention can be brought close to sensitivity of human eyes.

EXAMPLE 1

In the present example, examples of various electronic devices in which a photo-sensor obtained by the present invention is incorporated will be described. As an electronic device to which the present invention is applied, a computer, a display, a cellular phone, a television and the like are given. Specific examples of those electronic devices are shown in FIGS. 8, 9A and 9B, 10A and 10B, and 11, and 19.

Figure 8:
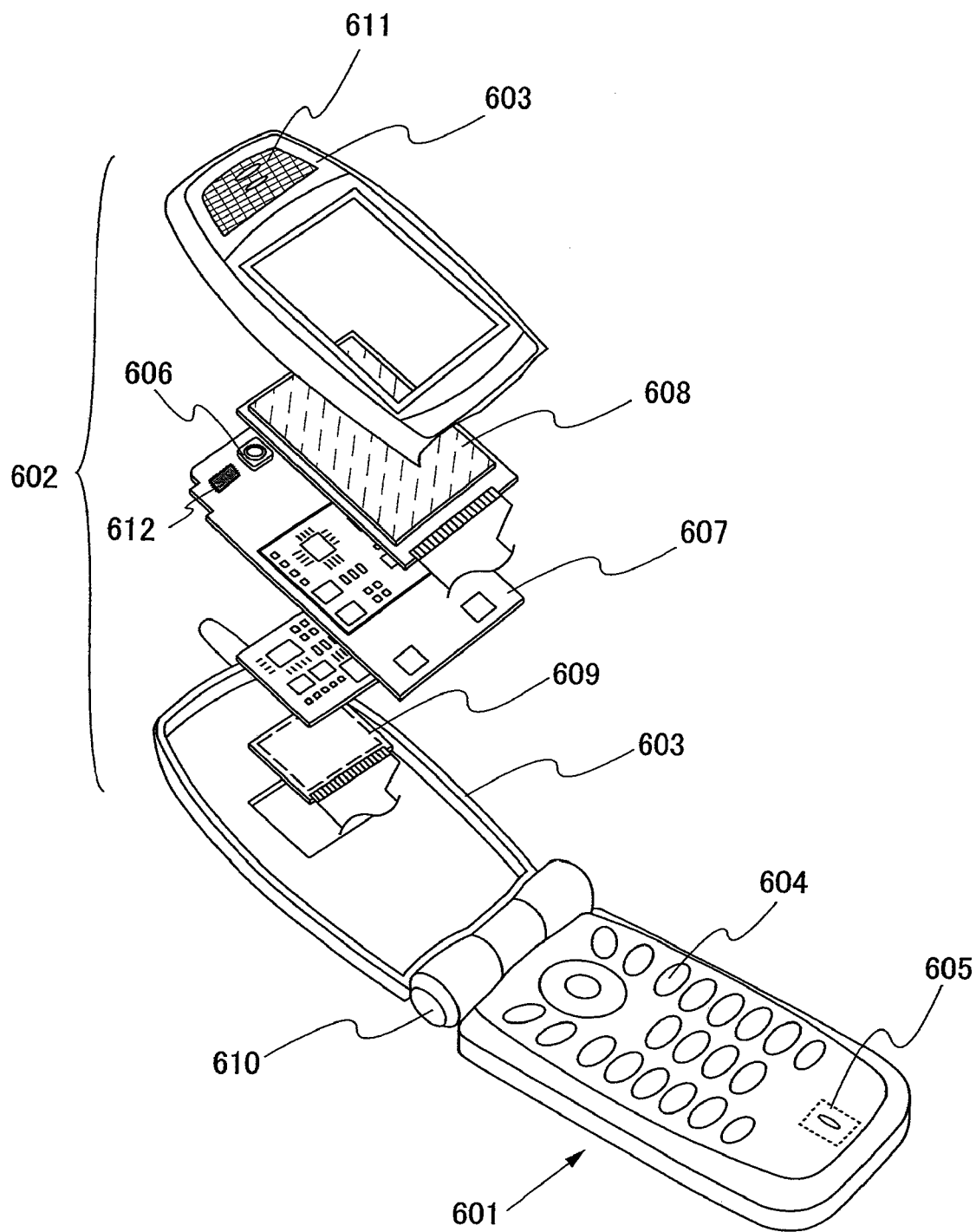
FIG. 8 is a view illustrating an example of an electronic device in which a photo-sensor according to the present invention is incorporated.

FIG. 8 shows a cellular phone, which includes a main body (A) 601, a main body (B) 602, a chassis 603, operation keys 604, a sound input portion 605, a sound output portion 606, a circuit substrate 607, a display panel (A) 608, a display panel (B) 609, a hinge 610, a light transmitting material portion 611, and a photo-sensor 612. The present invention can be applied to the photo-sensor 612.

The photo-sensor 612 detects light transmitted through the light transmitting material portion 611, and controls luminance of the display panel (A) 608 and the display panel (B) 609 depending on the illuminance of the detected extraneous light, or controls illumination of the operation keys 604 based on the illuminance obtained by the photo-sensor 612. In this manner, current consumption of the cellular phone can be suppressed.

Figure 9A:
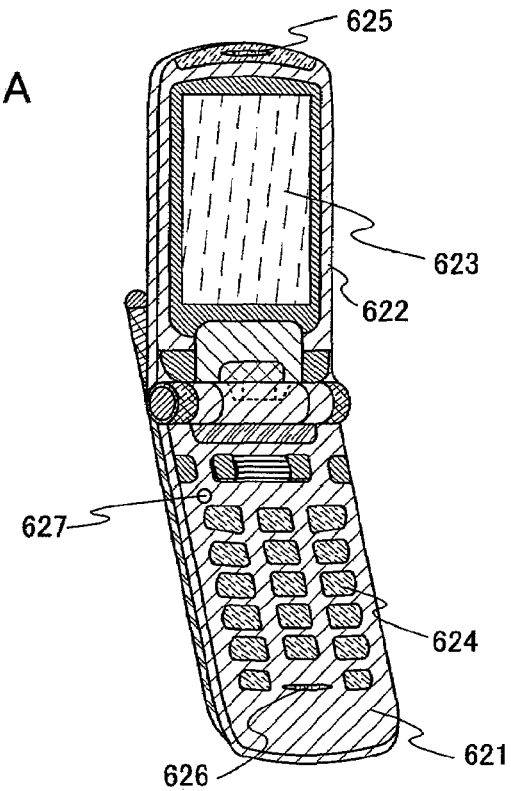
FIGS. 9A and 9B are views illustrating examples of electronic devices in which a photo-sensor according to the present invention is incorporated.
Figure 9B:
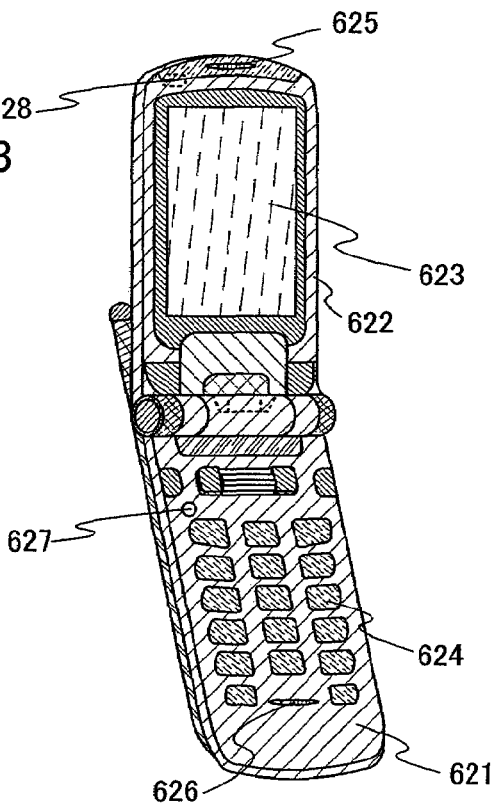

FIGS. 9A and 9B show other examples of a cellular phone. In FIGS. 9A and 9B, reference numeral 621 denotes a main body; 622, a chassis; 623, a display panel; 624, operation keys; 625, a sound output portion; 626, a sound input portion; and 627 and 628, photo-sensor portions.

In the cellular phone shown in FIG. 9A, luminance of the display panel 623 and the operation keys 624 can be controlled by detecting extraneous light by the photo-sensor portion 627 provided in the main body 621.

Furthermore, in the cellular phone shown in FIG. 9B, a photo-sensor portion 628 is provided inside the main body 621 in addition to the structure of FIG. 9A. By the photo-sensor portion 628, luminance of back light that is provided in the display panel 623 can also be detected.

Figure 10A:
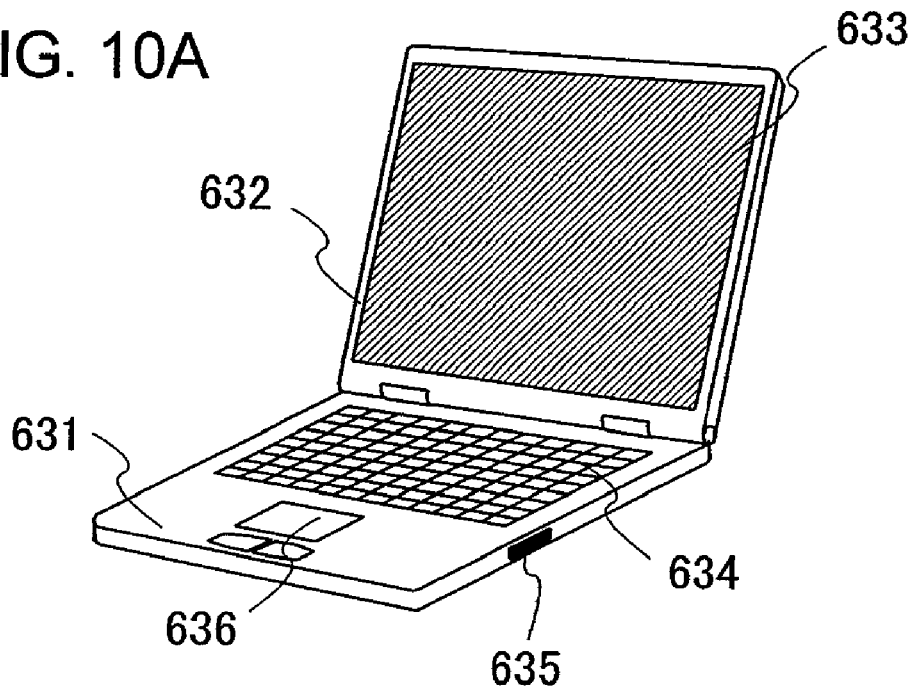
FIGS. 10A and 10B are views illustrating examples of electronic devices in which a photo-sensor according to the present invention is incorporated.

FIG. 10A shows a computer, which includes a main body 631, a chassis 632, a display portion 633, a key-board 634, an external connection port 635, a pointing mouse 636 and the like.

Figure 10B:
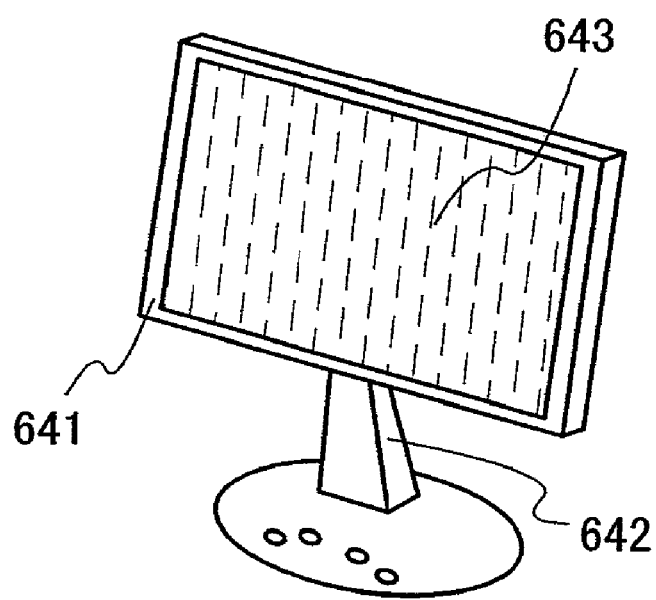

In addition, FIG. 10B shows a display device such as a TV set. The display device includes a chassis 641, a support 642, a display portion 643 and the like.

Figure 11:
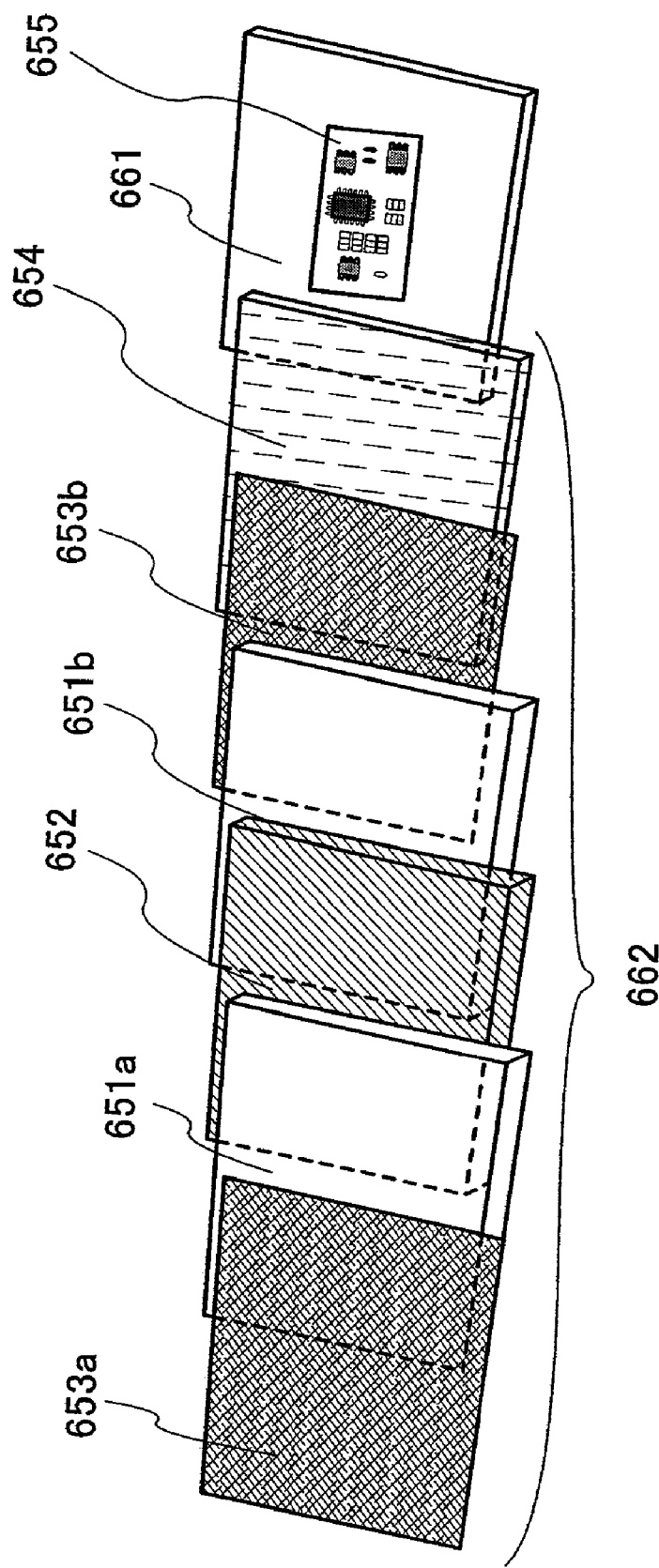
FIG. 11 is a view illustrating an example of an electronic device in which a photo-sensor according to the present invention is incorporated.

A detailed structure of the display portion 633 of the computer shown in FIG. 10A and the display portion 643 of the display device shown in FIG. 10B, to which a liquid crystal panel is used, is shown in FIG. 11.

A liquid crystal panel 662 shown in FIG. 11 is built in the chassis 661, and includes substrates 651a and 651b, a liquid crystal layer 652 interposed between the substrates 651a and 651b, polarizing filters 653a and 653b, back light 654 and the like. In addition, a photo-sensor portion 655 is formed in the chassis 661.

The photo-sensor portion 655 manufactured by using the present invention detects the amount of light from the back light 654, and the information is fed back to adjust luminance of the liquid crystal panel 662.

Figure 19A:
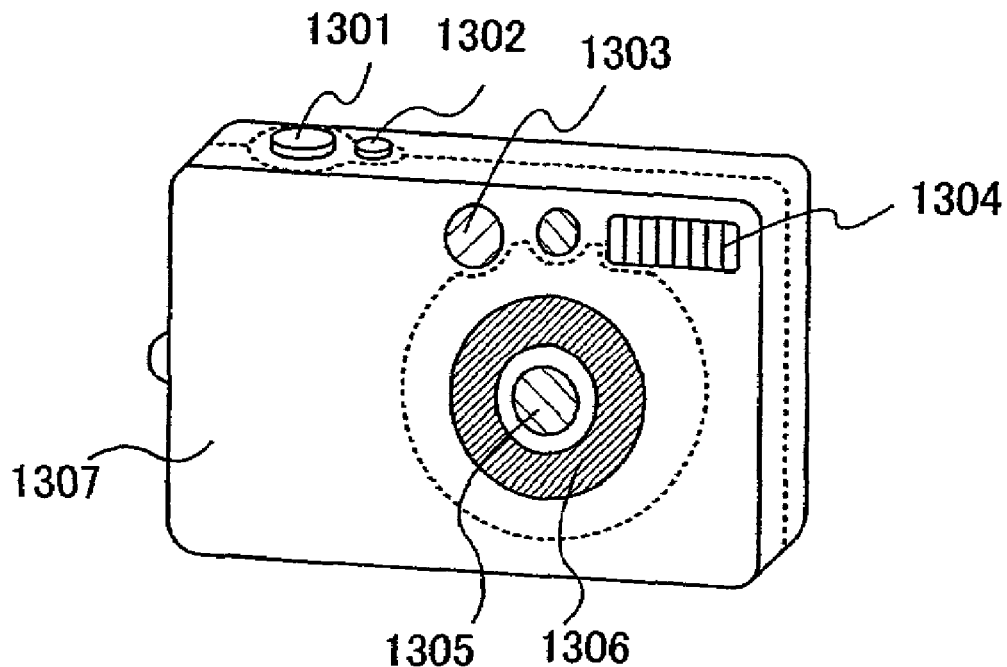
FIGS. 19A and 19B are views illustrating an example of an electronic device in which a photo-sensor according to the present invention is incorporated.
Figure 19B:
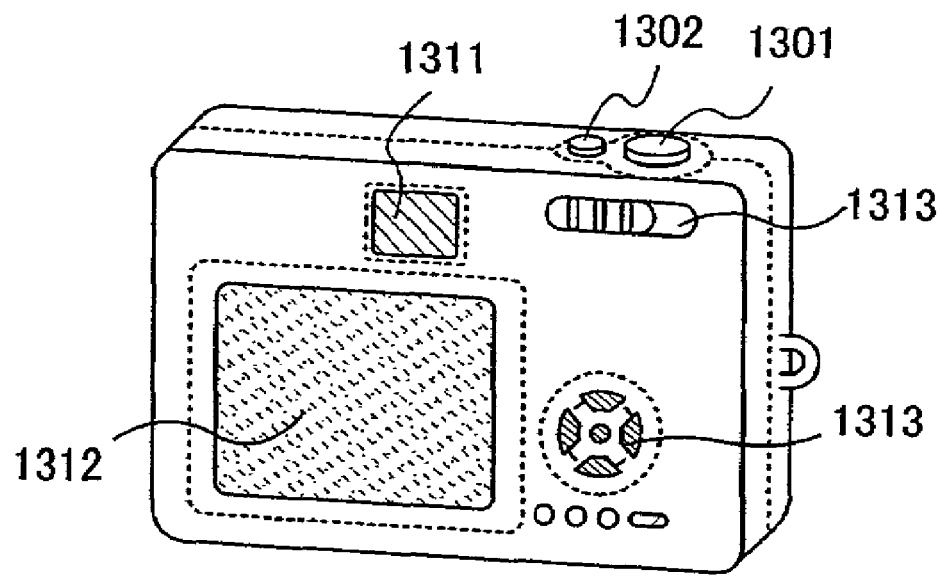

FIGS. 19A and 19B are drawings illustrating an example in which the photo-sensor according to the present invention is incorporated in a camera, for example, a digital camera. FIG. 19A is a perspective view from the front side of the digital camera, and FIG. 19B is a perspective view from the back side thereof. In FIG. 19A, a digital camera is provided with a release button 1301, a main switch 1302, a finder 1303, a flash portion 1304, a lens 1305, a barrel 1306, and a chassis 1307.

In addition, in FIG. 19B, a digital camera is provided with an eyepiece finder 1311, a monitor 1312, and an operation button 1313.

When the release button 1301 is pushed down to the half point, a focus adjustment mechanism and an exposure adjustment mechanism are operated, and when the release button is pushed down to the lowest point, a shutter is opened.

By pushing down or rotating the main switch 1302, a power supply of the digital camera is switched on or off.

The finder 1303 is a device located in the upper position of the lens 1305, which is on the front side of the digital camera, for checking a shooting range and the focus point from the eyepiece finder 1311 shown in FIG. 19B.

The flash portion 1304 is located in the upper position on the front side of the digital camera, from which, when the subject brightness is not enough, auxiliary light is emitted at the same time as the release button is pushed down and a shutter is opened.

The lens 1305 is located at the front of the digital camera, and formed by using a focusing lens, a zoom lens and the like. The lens forms a photographic optical system with a shutter and a diaphragm which are not illustrated. In addition, behind the lens, an image sensor such as a CCD (Charge Coupled Device) is provided.

The barrel 1306 moves a lens position to adjust the focus of the focusing lens, the zoom lens and the like. In shooting, the barrel is slid out to move the lens 1305 forward. Further, when carrying it, the lens 1305 is moved backward to be compact. It is to be noted that a structure is employed in the present example, in which the object can be photographed by zoom by sliding out the barrel; however, a structure is not limited thereto, and a structure may also be employed, in which shooting can be conducted by zoom without sliding out the barrel due to a structure of a photographic optical system inside the chassis 1307.

The eyepiece finder 1311 is located in the upper position on the back side of the digital camera for looking through when checking a shooting range and the focus point.

The operation button 1313 is a button for various functions provided on the back side of the digital camera, and formed by a set up button, a menu button, a display button, a functional button, a selecting button and the like.

When the photo-sensor according to the present invention is incorporated in the camera shown in FIGS. 19A and 19B, the photo-sensor can detect whether light exists or not, and the light intensity; and thus, an exposure adjustment of a camera and the like can be conducted.

In addition, the photo-sensor according to the present invention can also be applied to other electronic devices such as a projection TV and a navigation system. In other words, it can be applied to any electronic device as long as it needs to detect light.

EXAMPLE 2

In the present example, examples of providing an auxiliary electrode will be described with reference to FIGS. 4A and 4B, and 5.

Figure 4A:
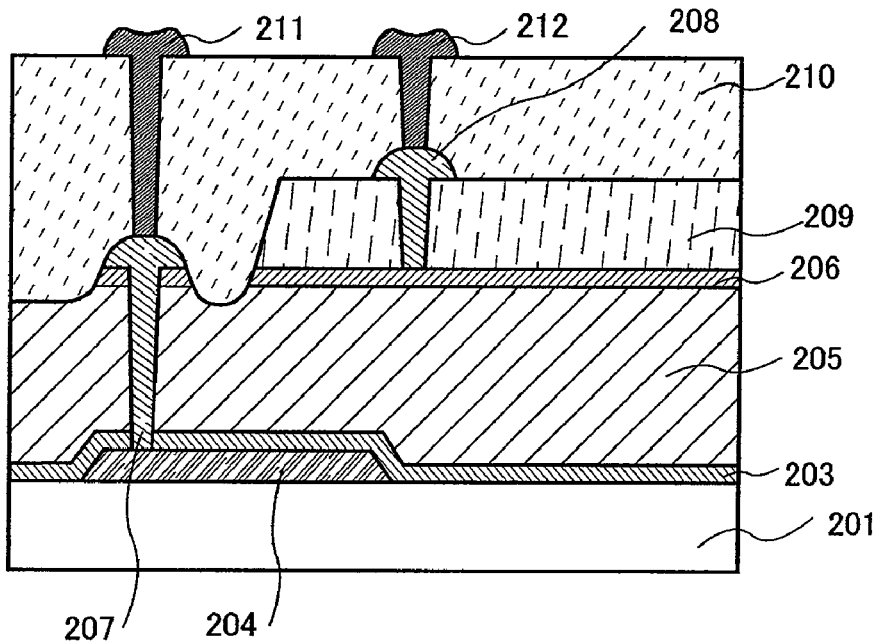
FIGS. 4A and 4B are views illustrating a manufacturing step of a photo-sensor according to the present invention.

In FIG. 4A, reference numeral 201 denotes a substrate; 203, a p-type semiconductor film; 205, an intrinsic semiconductor film; and 206, an n-type semiconductor film. In addition, 207 and 208 denote electrode layers; 209 and 210, insulating films, and 211 and 212, extraction electrodes.

The present example has a structure in which an auxiliary electrode 204 is provided in addition to the structure of the embodiment. The auxiliary electrode 204 may be formed by using a conductive film. In the present example, a transparent conductive film is used as the conductive film, and an indium oxide-tin oxide alloy containing silicon (Si) (also referred to as indium tin oxide containing Si) is used as the transparent conductive material. In addition to the indium oxide-tin oxide alloy containing Si, zinc oxide (ZnO), tin oxide ($SnO_2$), indium oxide, a conductive film material formed by using a target in which indium oxide is further mixed with 2 to 20 wt % of zinc oxide (ZnO) may also be used.

When an area of a light-receiving region can be kept sufficiently, the auxiliary electrode 204 may be formed by using a conductive film that is not a transparent conductive film. As such a conductive film, a single-layer film composed of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag) or copper (Cu), or an alloy material or a compound material containing the element as a main component; or a single-layer film composed of nitride thereof such as titanium nitride, tungsten nitride, tantalum nitride or molybdenum nitride may be used.

When the auxiliary electrode 204 is formed, while resistance of a whole element is lowered, there is an advantage that electric resistance of the p-type semiconductor film 203 and the n-type semiconductor film 206 can be the same by forming the auxiliary electrode 204 so as to come in contact with the p-type semiconductor film 203.

Figure 4B:
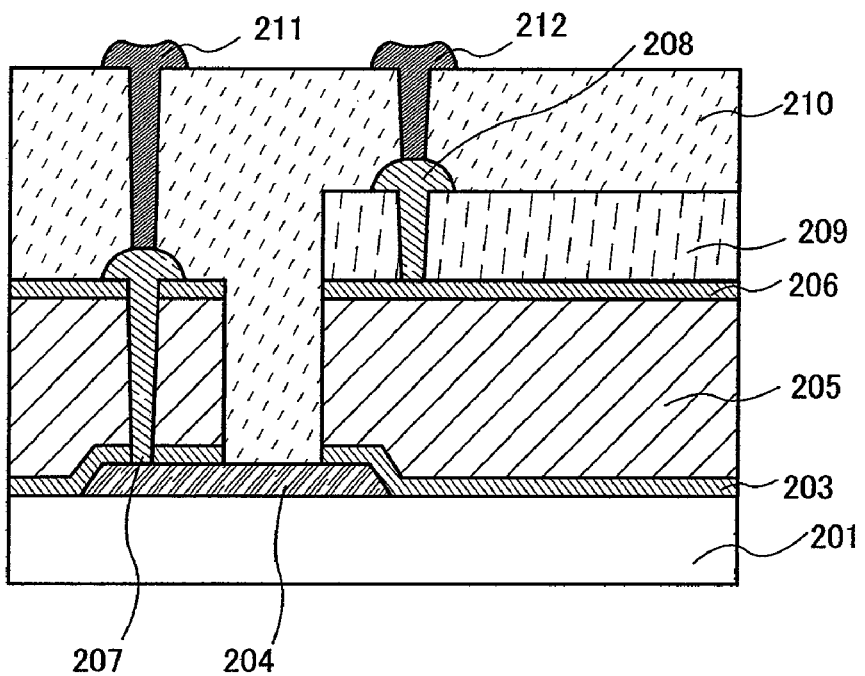

In addition, as shown in FIG. 4B, in the case of using the auxiliary electrode 204, etching can be conducted by using the auxiliary electrode 204 as an etching stopper when the intrinsic semiconductor film 205 is etched for separating the electrode layers 207 and 208. Therefore, the intrinsic semiconductor film 205 can be etched until the auxiliary electrode 204 is exposed.

Figure 5:
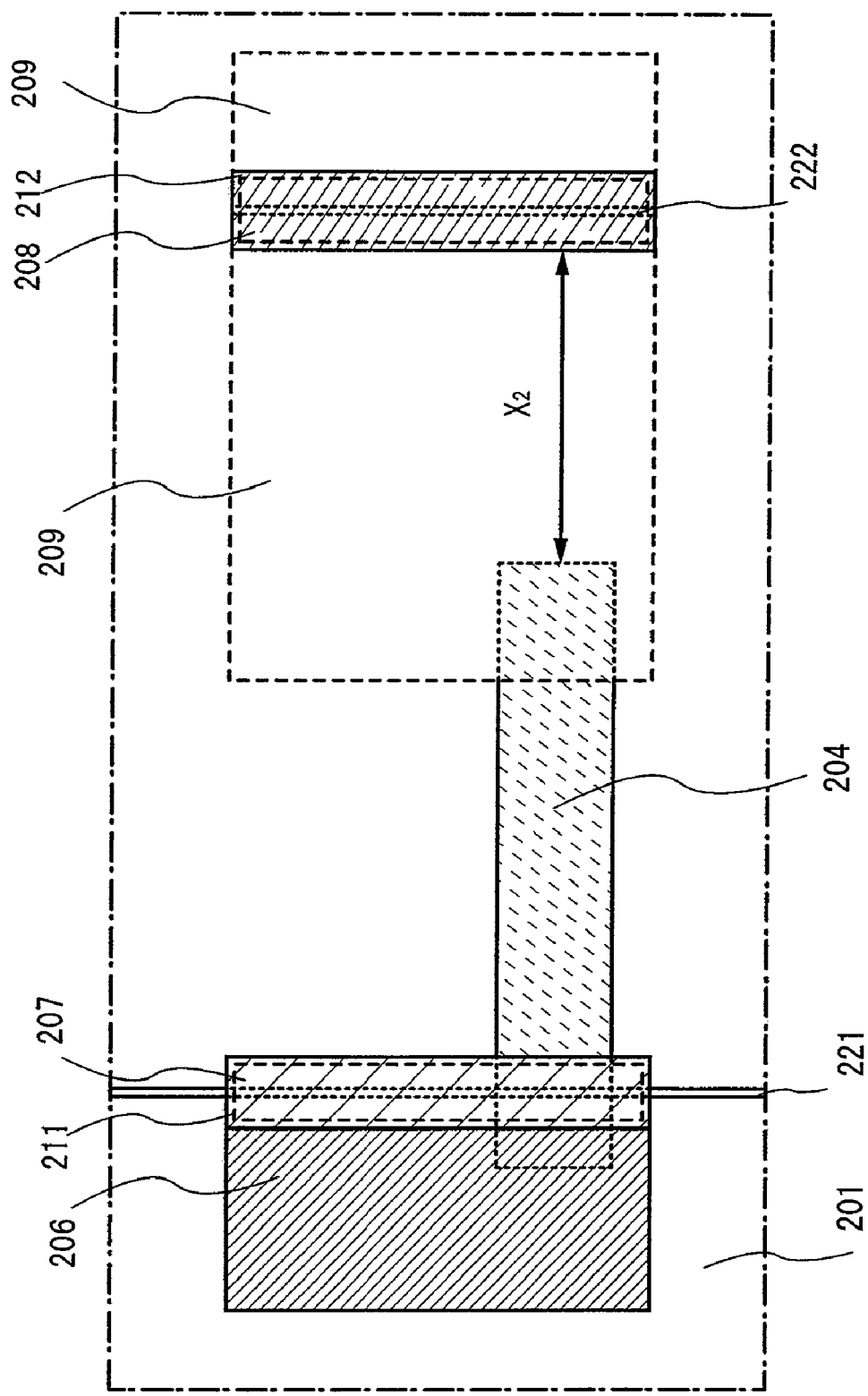
FIG. 5 is a top view of a photo-sensor according to the present invention.
Figure 6:
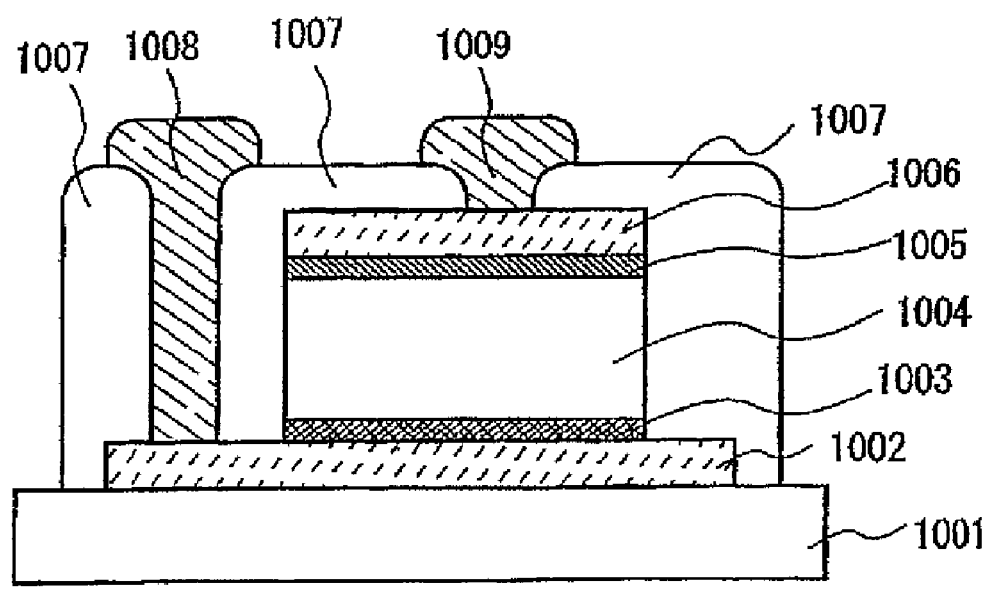
FIG. 6 is a cross-sectional view of a conventional photo-sensor.

FIG. 5 is a top view of the photo-sensor of FIG. 4B. It is to be noted that, in order to make a drawing clear, the insulating film 209 is indicated by a region surrounded by a dotted line and the insulating film 210 is not illustrated. Further, grooves 221 and 222 correspond to the grooves 107 and 108 of FIG. 1C.

When the distance between the auxiliary electrode 204 and the electrode layer 208 is referred to as $X_2$ (µm), resistance increases when $X_2$ is large. Therefore, it is necessary to determine $X_2$ in view of the resistance value of a whole element and withstand voltage to electrostatic discharge damage. In other words, when $X_2$ is too small, resistance is lowered, and withstand voltage to electrostatic discharge damage is also lowered. On the other hand, when $X_2$ is too large, resistance of the whole element increases too much, and it does not function as an element.

Furthermore, the present example can be applied to any descriptions of the Embodiment and the Example 1.

EXAMPLE 3

In the present example, examples of forming a color filter in the photo-sensor according to the present invention will be described with reference to FIGS. 7A and 7B.

Figure 7A:
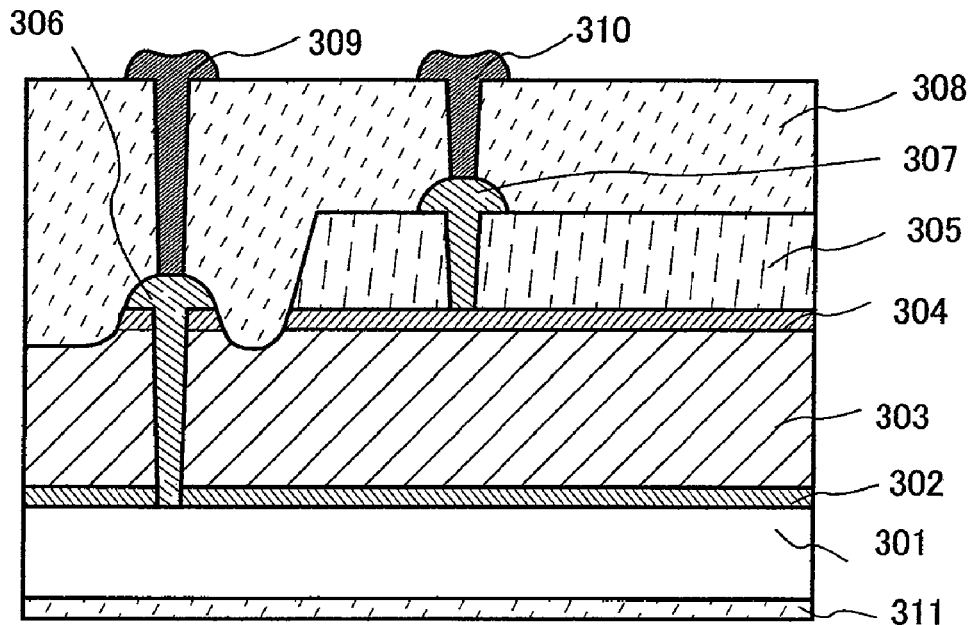
FIGS. 7A and 7B are views illustrating a manufacturing step of a photo-sensor according to the present invention.

FIG. 7A shows a photo-sensor in which a color filter is formed in the photo-sensor of FIG. 2C. In the photo-sensor of FIG. 7A, a substrate 301, a p-type semiconductor film 302, an intrinsic semiconductor film 303, an n-type semiconductor film 304, an insulating film 305, electrode layers 306 and 307, an insulating film 308, extraction electrodes 309 and 310, and a color filter 311 are formed.

By providing the color filter 311, each light of red (R), green (G) and blue (B) can be absorbed selectively.

Figure 7B:
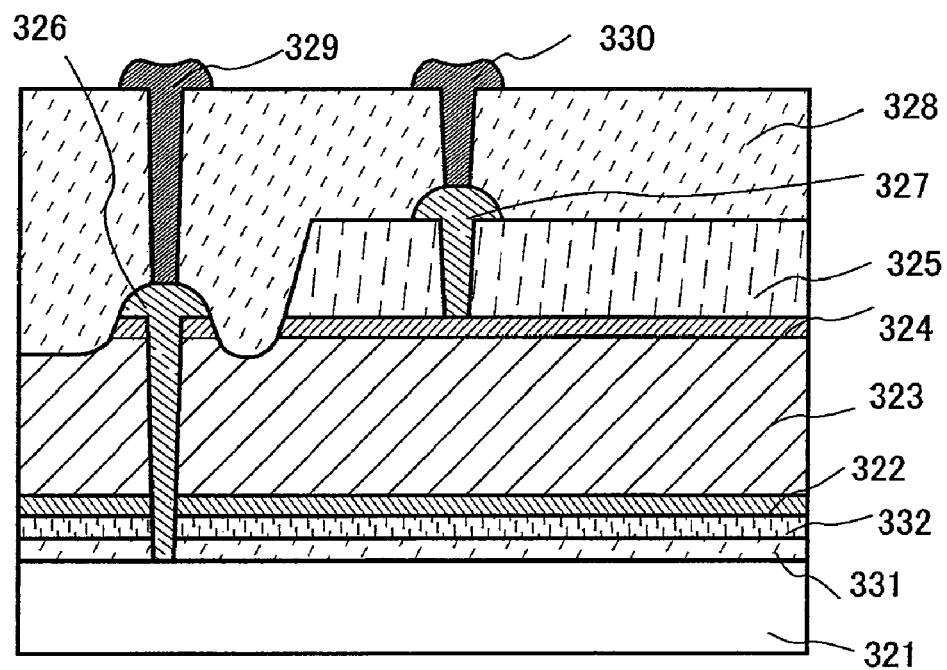

In addition, FIG. 7B shows an example in which a color filter is formed between a substrate and a photoelectric conversion layer.

In FIG. 7B, reference numeral 321 denotes a substrate; 322, a p-type semiconductor film; 323, an intrinsic semiconductor film; 324, an n-type semiconductor film; 325 and 328, insulating films; 326 and 327, electrode layers; 329 and 330, extraction electrodes; 331, a color filter; and 332, a passivation film. The passivation film 332 may be formed by using the same material as the insulating film 325.

In the structure shown in FIG. 7B, even when light enters obliquely from a substrate side, the light can transmit the color filter; and thus, the incident light can be used effectively.

Furthermore, the present example can be applied to any descriptions of the Embodiment and the Examples 1 and 2.

EXAMPLE 4

In the present example, a semiconductor device using the photoelectric conversion device according to the present invention will be described with reference to FIGS. 13A and 13B, 14A and 14B, 15A to 15C, 16, 17, and 20A to 20 D.

Figure 13A:
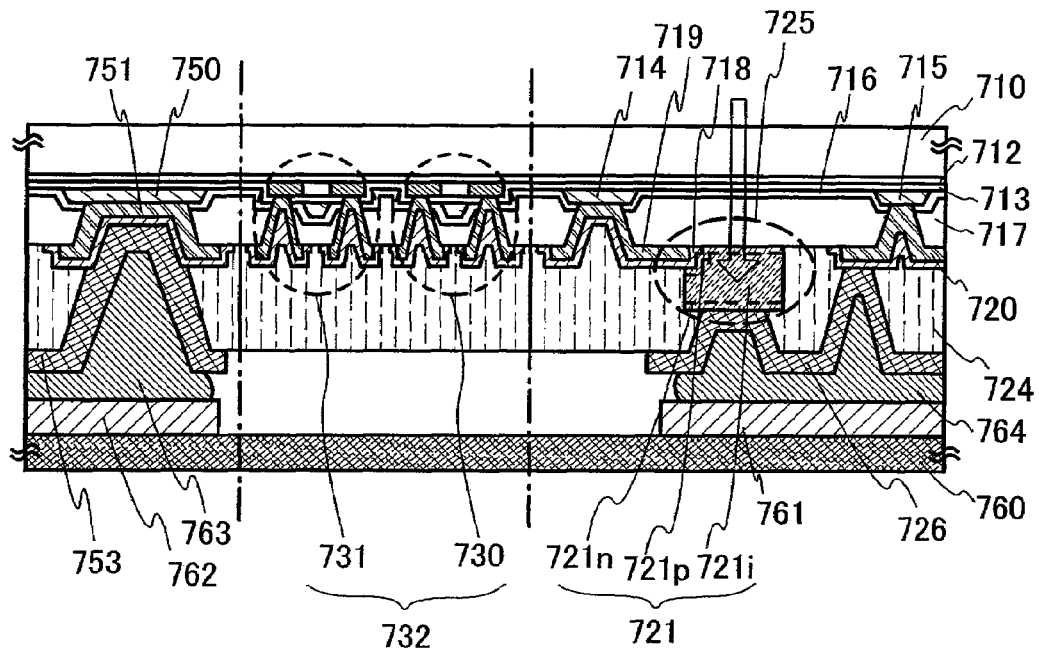
FIGS. 13A and 13B are views illustrating a manufacturing step of a device in which a photo-sensor according to the present invention is mounted.

In FIG. 13A, as an example of a semiconductor device using the photoelectric conversion device according to the present invention, an example of a photo-sensor chip (2.0 mm×1.5 mm) for visible light with two terminals is shown. In FIG. 13A, reference numeral 710 denotes a substrate; 712, a base insulating film; and 713, a gate insulating film. Since received light transmits the substrate 710, the base insulating film 712 and the gate insulating film 713, it is desirable to use a highly light-transmitting material for all of them.

A PIN-type photoelectric conversion element 725 may be formed based on the description of the embodiment, and the present example shows a brief description thereof. The photoelectric conversion element 725 according to the present example includes a wiring 719, a protective electrode 718, a p-type semiconductor layer 721p, an n-type semiconductor layer 721n, an intrinsic (i-type) semiconductor layer 721i interposed between the p-type semiconductor layer 721p and the n-type semiconductor layer 721n, which are the photoelectric conversion layer 725, and a terminal electrode 726.

The wiring 719 has a stacked structure of a refractory metal film and a low resistance metal film (such as an aluminum alloy or pure aluminum). Here, the wiring 719 has a three-layer structure in which a titanium film (Ti film), an aluminum film (Al film) and a Ti film are stacked sequentially. The protective electrode 718 is formed to cover the wiring 719.

When the photoelectric conversion layer 721 is etched, the wiring 719 is protected by the protective electrode 718 covering the wiring 719. A material for the protective electrode 718 is preferably a conductive material in which an etching rate is lower than in the photoelectric conversion layer with respect to an etching gas (or an etchant) for the photoelectric conversion layer 721. In addition, a material for the protective electrode 718 is preferably a conductive material which does not react with the photoelectric conversion layer 721 to be an alloy.

In addition, a circuit for signal processing of the output value of the PIN-type photoelectric conversion element 725 is provided. In the present example, an amplifier circuit is provided as the circuit for signal processing of the output value of the PIN-type photoelectric conversion element 725. The amplifier circuit provided over the same substrate to amplify the output value of the photoelectric conversion element 725 is formed by a current mirror circuit 732 by n-channel thin film transistors (Thin Film Transistor (TFT)) 730 and 731 (FIG. 13A).

Figure 13B:
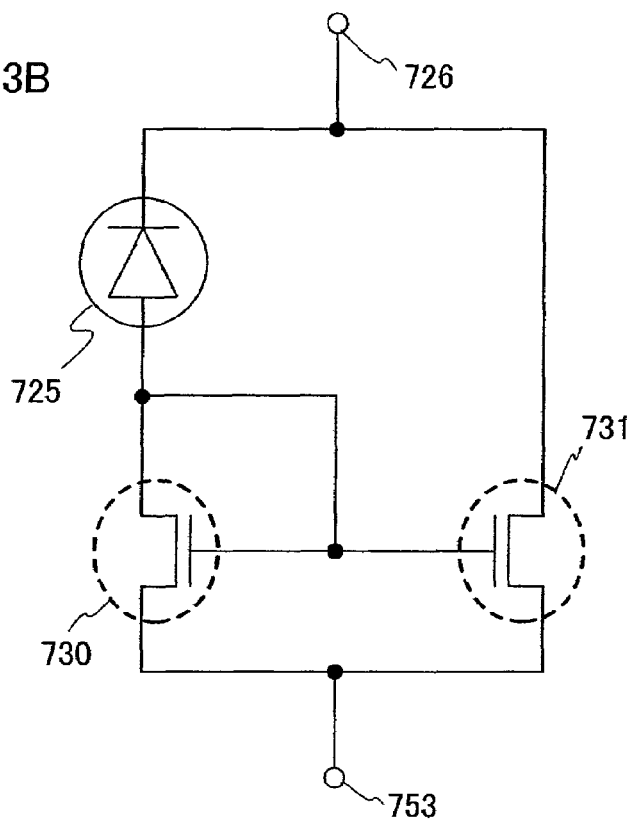

In addition, an equivalent circuit diagram of a photo-sensor for visible light with two terminals is shown in FIG. 13B. FIG. 13B is an equivalent circuit diagram using an n-channel TFT; however, only a p-channel TFT may also be used instead of the n-channel TFT.

Two TFTs are illustrated in FIG. 13A. However, for example, in order to increase the output value by five times, 2 pieces of the n-channel TFT 730 (channel-length (L) and channel width (W) are 8 µm and 50 µm, respectively) and 10 pieces of the n-channel TFT 731 (channel-length (L) and channel width (W) are 8 µm and 50 µm, respectively) may be provided.

Figure 16:
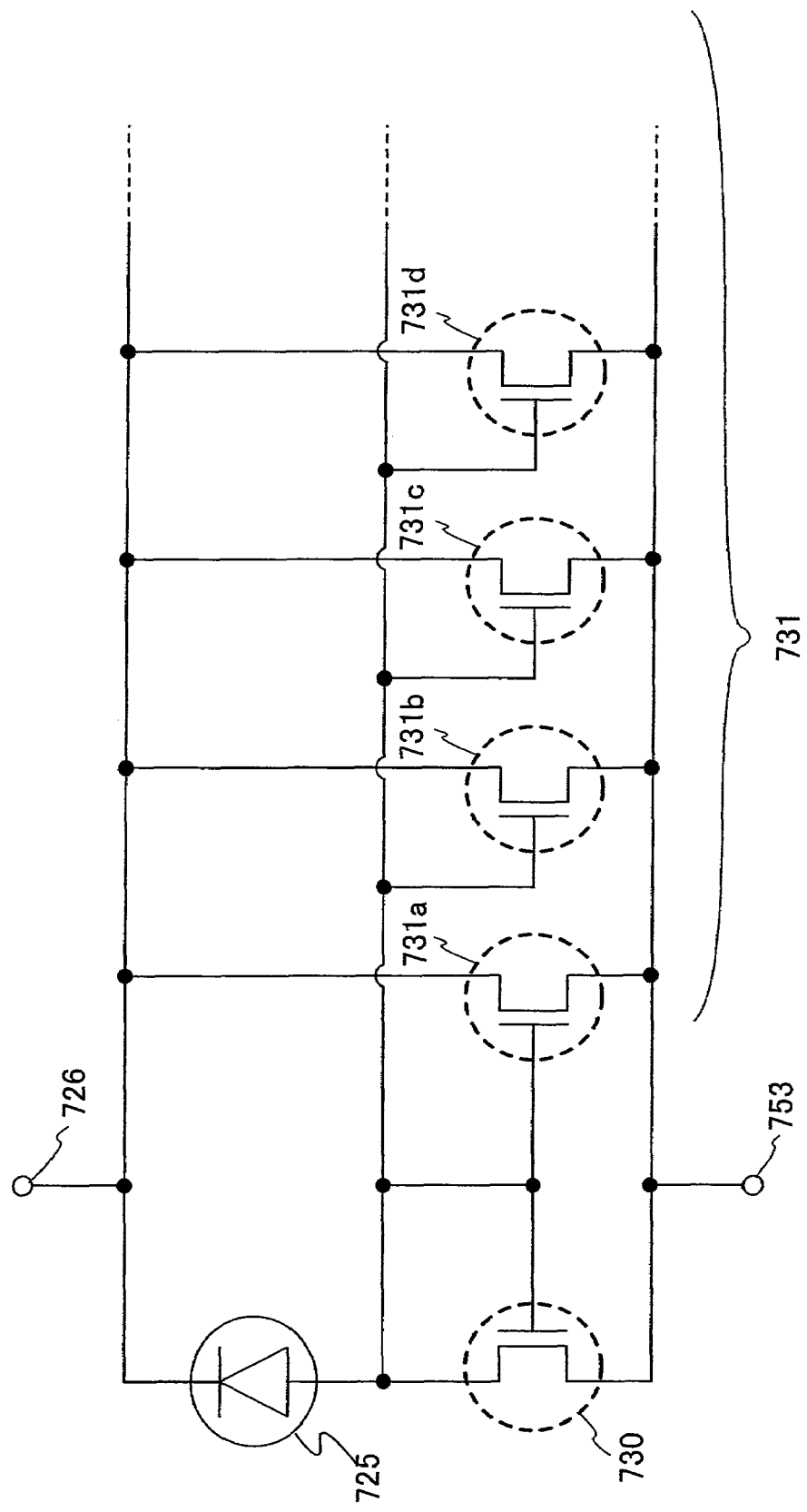
FIG. 16 is an equivalent circuit diagram of a photo-sensor for visible light in which a photo-sensor according to the present invention is incorporated.

Further, in order to increase the output value by m times, a piece of the n-channel TFT 730 and m pieces of the n-channel TFT 731 may be provided. Specifically, an example of providing a piece of the n-channel TFT 730 and 100 pieces of the n-channel TFT 731 in order to increase the output value by 100 times is shown in FIG. 16. It is to be noted that the same reference numerals as in FIGS. 13A and 13B, and 14A to 14C are used for the same portions in FIG. 16. In FIG. 16, the n-channel TFT 731 includes 100 pieces of n-channel TFT 731a, 731b, 731c, 731d, . . . . In this manner, a photoelectric current generated in the photoelectric conversion element 725 is amplified by 100 times and outputted.

Figure 17:
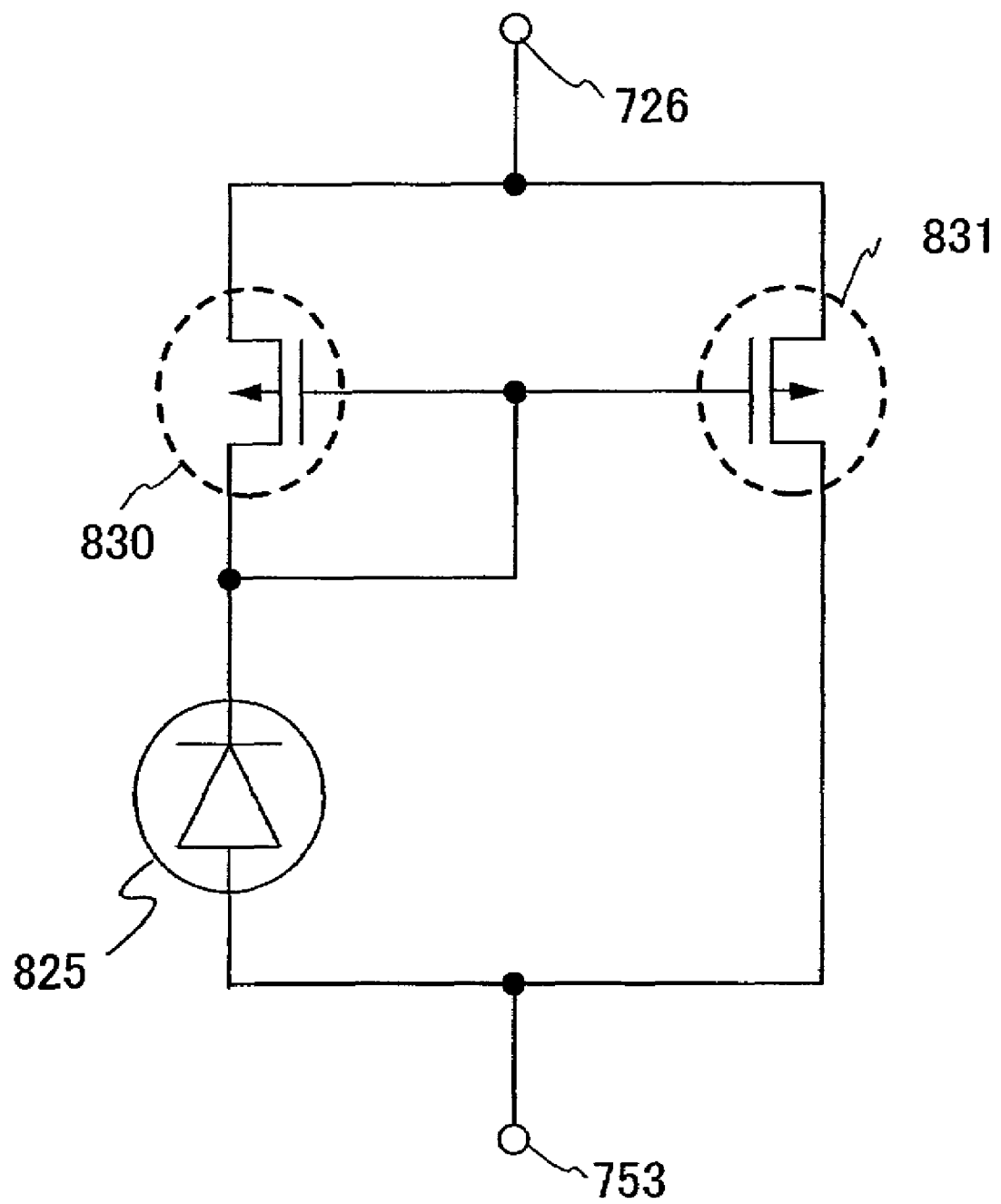
FIG. 17 is an equivalent circuit diagram of a photo-sensor for visible light in which a photo-sensor according to the present invention is incorporated.

FIG. 17 is an equivalent circuit diagram in the case where the amplifier circuit is formed by using a p-channel TFT. In FIG. 17, terminal electrodes 726 and 753 are the same as in FIG. 13B, which may be connected to a photoelectric conversion element 825 and p-channel TFTs 830 and 831 respectively. The p-channel TFT 830 is electrically connected to an electrode on the anode side of the photoelectric conversion element 825. In the photoelectric conversion element 825, an n-type semiconductor layer, an intrinsic semiconductor layer (an i-type semiconductor layer), and a p-type semiconductor layer are stacked in this order over a second electrode (an electrode on the anode side) connected to the p-channel TFT 830; and then, a first electrode (an electrode on the cathode side) may be formed. In addition, a photoelectric conversion element having a reverse stacking order may also used, in which a p-type semiconductor layer, an intrinsic semiconductor layer (an i-type semiconductor layer) and an n-type semiconductor layer are stacked in this order over a first electrode (an electrode on the cathode side); and then, a second electrode (an electrode on the anode side) connected to the p-channel TFT 830 is formed, and a terminal electrode on the cathode side connected to the first electrode may be formed.

An amplifier circuit to further amplify the output value may be formed by using an operational amplifier in which an n-channel TFT and a p-channel TFT are appropriately combined; however, the amplifier circuit has five terminals. Meanwhile, the number of power supplies can be reduced, and the amplifier circuit has four terminals by forming the amplifier circuit by using an operational amplifier and a level shifter.

It is to be noted that the amplifier circuit to amplify the output value is formed in the present example; however, a circuit for converting the output value into another output form or the like may also be manufactured instead of the amplifier circuit, if necessary.

In addition, in FIG. 13A, an example of a top gate TFT in which the n-channel TFTs 730 and 731 include one channel formation region (referred to as "single gate structure" in the present specification) is shown; however, a structure including a plurality of channel formation regions may also be employed to reduce variation in ON current value. Further, the n-channel TFTs 730 and 731 may be provided with a low-concentration drain (Lightly Doped Drain (LDD)) region to reduce the OFF current value. An LDD region is a region doped with an impurity element at a low concentration between the channel formation region and a source region or drain region that is formed by adding an impurity element at a high concentration. When an LDD region is provided, there is an advantageous effect that an electric field in the vicinity of a drain region is relieved, thereby preventing deterioration due to hot carrier injection. In addition, in order to prevent deterioration in ON current value due to a hot carrier, the n-channel TFTs 730 and 731 may have a structure in which an LDD region is stacked over a gate electrode with a gate insulating film interposed therebetween (referred to as "GOLD (Gate-drain Overlapped LDD) structure" in the present specification).

In the case of using the GOLD structure, the advantageous effect of relieving an electric field in the vicinity of a drain region, thereby preventing deterioration due to hot carrier injection is more enhanced than in the case where the LDD region does not overlap with the gate electrode. It is effective to employ such a GOLD structure in order to prevent a deterioration phenomenon since an electric field intensity in the vicinity of a drain region is relieved, thereby preventing hot carrier injection.

In addition, the wiring 714 is a wiring that is connected to the wiring 719, and extends to the upper portion of the channel formation region of the TFT 730 of the amplifier circuit to serve as a gate electrode.

In addition, the wiring 715 is a wiring that is connected to the n-type semiconductor layer 721n and further connected to a drain wiring (also referred to as a drain electrode) or a source wiring (also referred to as a source electrode) of the TFT 731. Further, reference numerals 716 and 717 denote insulating films; and 720, a connecting electrode. Since received light transmits the insulating films 716 and 717, it is desirable to use a highly light-transmitting material for all of them. A silicon oxide film (SiOx film) formed by CVD is preferably used for the insulating film 717. When a silicon oxide film formed by CVD is used for the insulating film 717, anchoring intensity is improved.

In addition, a terminal electrode 750 is formed in the same step as the wirings 714 and 715, and a terminal electrode 751 is formed in the same step as the wirings 719 and 720.

In addition, a terminal electrode 726 is connected to the n-type semiconductor layer 721n, and mounted over an electrode 761 of a printed wiring board 760 with solder 764. In addition, a terminal electrode 753 is formed in the same step as the terminal electrode 726, and mounted over an electrode 762 of the printed wiring board 760 with solder 763.

Hereinafter, manufacturing steps to obtain the structure as described above will be described with reference to FIGS. 14A to 14C and 20A to 20D.

First, an element is formed over a substrate (a first substrate 710). Here, AN 100 that is one of glass substrates is used as the substrate 710.

Subsequently, a silicon oxide film containing nitrogen which serves as a base insulating film 712 (100 nm thick) is formed by plasma CVD, and a semiconductor film such as an amorphous silicon film containing hydrogen (54 nm thick) is stacked thereover without being exposed to atmospheric air. In addition, a silicon oxide film, a silicon nitride film and a silicon oxide film containing nitrogen may be stacked to form the base insulating film 712. Specifically, a silicon nitride film containing oxygen of 50 nm, and further, a silicon oxide film containing nitrogen of 100 nm may be staked to form the base insulating film 712. It is to be noted that the silicon oxide film containing nitrogen or the silicon nitride film serves as a blocking layer for preventing diffusion of an impurity such as an alkali metal from a glass substrate.

Then, the amorphous silicon film is crystallized by using a known technique (such as a solid-phase growth method, a laser crystallization method, or a crystallization method using a catalyst metal) to form a semiconductor film having a crystal structure (a crystalline semiconductor film), for example, a polycrystal silicon film. Here, a polycrystal silicon film is obtained by a crystallization method using a catalyst element. A nickel acetate solution containing nickel of 10 ppm by weight is applied by a spinner. It is to be noted that a nickel element may be dispersed over the entire surface by sputtering instead of applying. Then, a heat treatment is conducted for crystallization to form a semiconductor film having a crystal structure (here, a polycrystal silicon film). Here, a polycrystal silicon film is obtained by a heat treatment for crystallization (at 550° C. for 4 hours) after the heat treatment (at 550° C. for one hour).

Next, an oxide film over the surface of the polycrystal silicon film is removed by a dilute hydrofluoric acid or the like. Thereafter, irradiation of laser light (XeCl: wavelength of 308 nm) for raising a degree of crystallization and repairing a defect left in a crystal grain is performed in an atmospheric air or in an oxygen atmosphere.

Excimer laser light of a wavelength of 400 nm or less, or the second harmonic or the third harmonic of a YAG laser is used for the laser light. Here, pulsed laser light having a repetition frequency of approximately 10 to 1000 Hz is used. The laser light is condensed to 100 to 500 mJ/cm$^2$ by an optical system, and irradiation is performed with an overlap rate of 90 to 95%, thereby scanning the silicon film surface. In the present example, the irradiation of the laser light is performed in an atmospheric air with a repetition frequency of 30 Hz and energy density of 470 mJ/cm$^2$.

It is to be noted that an oxide film is formed over the surface by the laser light irradiation since the irradiation is conducted in an atmospheric air or in an oxygen atmosphere. Although an example of using the pulsed laser is shown in the present example, a continuous wave laser may also be used. For crystallization of a semiconductor film, it is preferable that the second harmonic to the fourth harmonic of the fundamental wave be applied by using a continuous wave solid state laser in order to obtain a crystal of a large grain size. As a typical example, the second harmonic (532 nm) or the third harmonic (355 nm) of an Nd:YVO$_4$ laser (fundamental wave of 1064 nm) may be applied.

In the case of using a continuous wave laser, laser light emitted from the continuous wave type YVO$_4$ laser of 10 W output is converted into harmonics by using a non-linear optical element. Further, a method of emitting harmonics by applying a YVO$_4$ crystal and the non-linear optical element into a resonator can also be given. Then, the laser light having a rectangular shape or an elliptical shape on an irradiated face is preferably formed by an optical system, and an object is irradiated with this laser light. At this time, the energy density of approximately 0.01 to 100 MW/cm$^2$ (preferably, 0.1 to 10 MW/cm$^2$) is required. The semiconductor film may be moved at approximately 10 to 2000 cm/s rate relatively with respect to the laser light so as to be irradiated.

Then, in addition to the oxide film formed by the laser light irradiation, a barrier layer made of an oxide film having a thickness of 1 to 5 nm in total is formed by treating the surface with ozone water for 120 seconds. The barrier layer is formed in order to remove a catalyst element, which is added for crystallization, such as nickel (Ni) from the film. Although the barrier layer is formed by using ozone water here, a barrier layer may also be formed by depositing an oxide film of approximately 1 to 10 nm thick by using a method of oxidizing a surface of a semiconductor film having a crystal structure by UV-ray irradiation in an oxygen atmosphere, a method of oxidizing a surface of a semiconductor film having a crystal structure by an oxygen plasma treatment, plasma CVD, sputtering, evaporation or the like. In addition, before forming the barrier layer, the oxide film formed by laser light irradiation may be removed.

Then, over the barrier layer, an amorphous silicon film containing an argon element is formed to be 10 nm to 400 nm thick, for example 100 nm thick here, by sputtering to serve as a gettering site. Here, the amorphous silicon film containing an argon element is formed in an atmosphere containing argon using a silicon target. When plasma CVD is used to form the amorphous silicon film containing an argon element, the deposition condition is as follows: a flow ratio of monosilane to argon (SiH$_4$:Ar) is set to be 1:99; deposition pressure is set to be 6.665 Pa; the RF power density is set to be 0.087 W/cm$^2$; a deposition temperature is set to be 350° C.

Thereafter, a furnace heated to 650° C. is used for a heat treatment for three minutes to remove a catalyst element (gettering). By this treatment, the catalyst element concentration in the semiconductor film having a crystal structure is reduced. A lamp annealing apparatus may also be used instead of the furnace.

Subsequently, the amorphous silicon film containing an argon element, which is a gettering site, is selectively removed with the barrier layer as an etching stopper, and then, the barrier layer is selectively removed by dilute hydrofluoric acid. It is to be noted that there is a tendency that nickel is likely to move to a region with a high oxygen concentration in gettering, and thus, it is desirable that the barrier layer made of the oxide film be removed after gettering.

It is to be noted that, in the case where crystallization of a semiconductor film using a catalytic element is not performed, the above described steps such as the formation of the barrier layer, the formation of the gettering site, the heat treatment for gettering, the removal of the gettering site, and the removal of the barrier layer are not required.

Figure 20A:
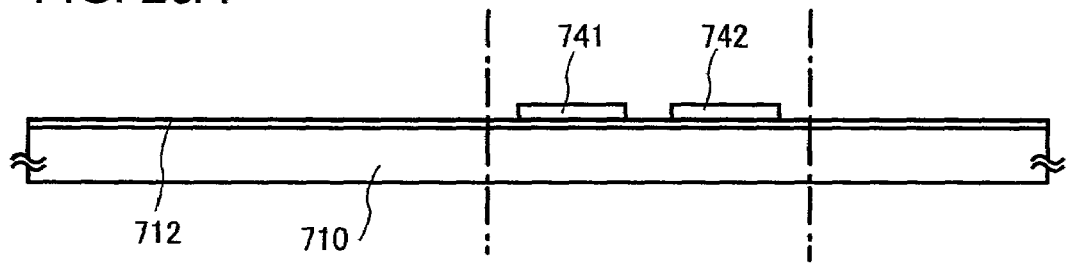
FIGS. 20A to 20 D are views illustrating a manufacturing step of a device in which a photo-sensor according to the present invention is mounted.

Then, after a thin oxide film is formed with ozone water over the surface of the obtained semiconductor film having a crystal structure (such as a crystalline silicon film), a mask made of resist is formed by using a first photomask, and an etching treatment is conducted to obtain a desired shape, thereby forming semiconductor films 741 and 742 separated in island shapes (referred to as "island-like semiconductor region" in the present specification) (refer to FIG. 20A). After forming the island-like semiconductor regions 741 and 742, the mask made of resist is removed.

Subsequently, if necessary, doping of the very small amount of an impurity element (boron or phosphor) is performed to control the threshold value of a TFT. Here, ion doping is used, in which diborane (B$_2$H$_6$) is not separated by mass but excited by plasma.

Next, the oxide film is removed with an etchant containing hydrofluoric acid, and at the same time, the surface of the island-like semiconductor region is washed. Thereafter, an insulating film containing silicon as a main component, which serves as a gate insulating film 713, is formed. Here, a silicon oxide film containing nitrogen (composition ratio: Si=32%, O=59%, N=7%, H=2%) is formed to have a thickness of 115 nm by plasma CVD.

Figure 20B:
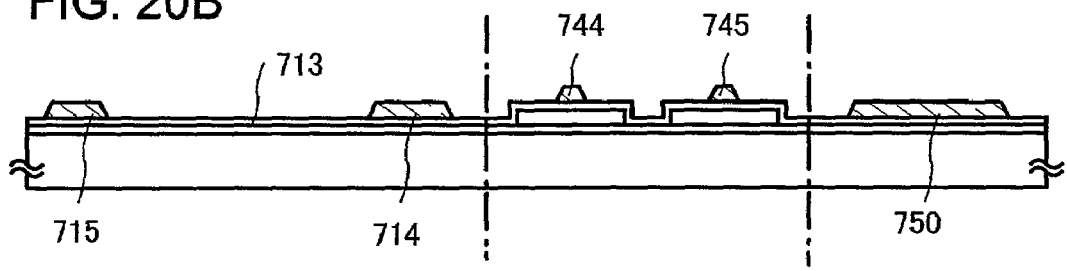

Then, after a metal film is formed over the gate insulating film 713, a second photomask is used to form gate electrodes 744 and 745, wirings 714 and 715, and a terminal electrode 750 (refer to FIG. 20B). For example, as the metal film, a film which is formed by stacking tantalum nitride (TaN) and tungsten (W) to be 30 nm and 370 nm respectively is used.

In addition to the above described materials, as the gate electrodes 744 and 745, the wirings 714 and 715 and the terminal electrode 750, a single-layer film composed of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag) or copper (Cu), or an alloy material or a compound material containing the element as a main component; or a single-layer film composed of nitride thereof such as titanium nitride, tungsten nitride, tantalum nitride or molybdenum nitride can be used.

Figure 20C:
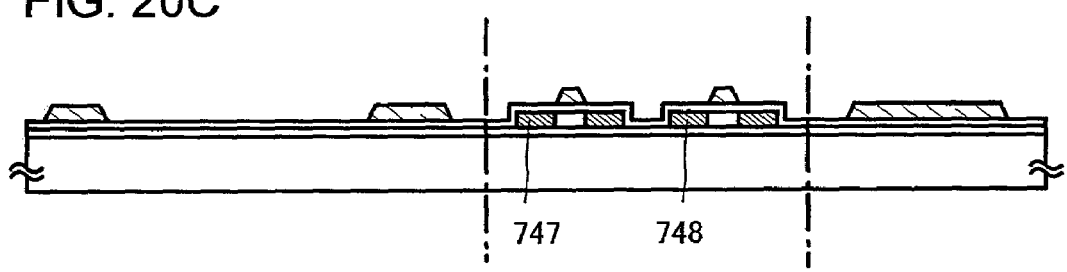

Then, doping to the island-like semiconductor regions 741 and 742 is performed to form a source region or drain region 747 of the TFT 730 and a source region or drain region 748 of the TFT 731 (refer to FIG. 20C). In addition, in the island-like semiconductor region 741 of the TFT 730, a channel formation region is formed between a source region and a drain region, and then, in the island-like semiconductor region 742 of the TFT 731, a channel formation region is formed between a source region and a drain region.

Subsequently, after a first interlayer insulating film containing silicon oxide film (not illustrated) is formed to be 50 nm by CVD, a step for an activation treatment of an impurity element added to each island-like semiconductor region is conducted. The activation step is conducted by rapid thermal annealing (RTA method) using a lamp light source, a method of irradiation of a YAG laser or an excimer laser from the back side, a heat treatment using a furnace, or a method which is a combination of the foregoing methods.

Next, a second interlayer insulating film 716 including a silicon nitride film containing hydrogen and oxygen is formed to have a film thickness of, e.g. 10 nm.

Figure 20D:
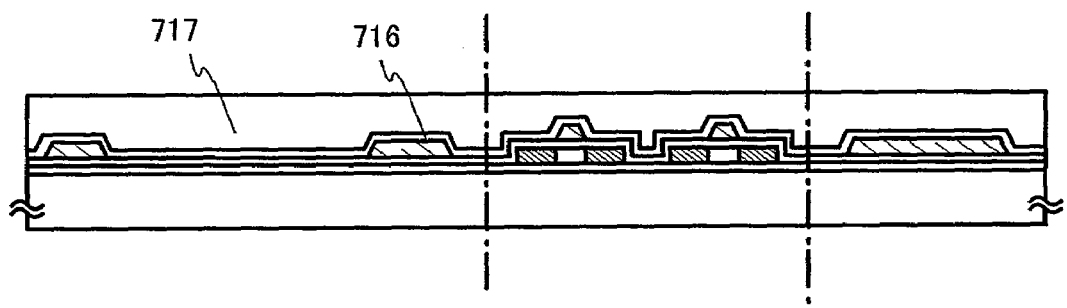

Subsequently, a third interlayer insulating film 717 made of an insulator material is formed over the second interlayer insulating film 716 (refer to FIG. 20D). An insulating film obtained by CVD can be used for the third interlayer insulating film 717. In the present example, in order to improve adhesiveness, a silicon oxide film containing nitrogen is formed to have a film thickness of 900 nm as the third interlayer insulating film 717.

Then, a heat treatment (a heat treatment at 300 to 550° C. for 1 to 12 hours, for example, at 410° C. for one hour in a nitrogen atmosphere) is conducted to hydrogenate the island-like semiconductor film. This step is conducted to terminate a dangling bond in the island-like semiconductor film by hydrogen contained in the second interlayer insulating film 716. The island-like semiconductor film can be hydrogenated regardless of whether or not the gate insulating film 713 is formed.

In addition, as the third interlayer insulating film 717, an insulating film using siloxane and a stacked structure thereof can also be used. Siloxane is composed by a skeleton structure of a bond of silicon (Si) and oxygen (O). As a substituent, a compound containing at least hydrogen (such as an alkyl group or an aromatic hydrocarbon) is used. Fluorine may also be used as a substituent. Moreover, a compound containing at least hydrogen and fluorine may be used as a substituent.

When an insulating film using siloxane and a stacked structure thereof are used as the third interlayer insulating film 717, after forming the second interlayer insulating film 716, a heat treatment for hydrogenating the island-like semiconductor film may be conducted, and then, the third interlayer insulating film 717 may be formed.

Then, a mask made of resist is formed by using a third photomask, and the first interlayer insulating film, the second interlayer insulating film 716, and the third interlayer insulating film 717, and the gate insulating film 713 are selectively etched to form a contact hole. Then, the mask made of resist is removed.

It is to be noted that the third interlayer insulating film 717 may be formed if necessary. When the third interlayer insulating film 717 is not formed, after forming the second interlayer insulating film 716, the first interlayer insulating film, the second interlayer insulating film 716, and the gate insulating film 713 are selectively etched to form a contact hole.

Subsequently, after forming a metal stacked film by sputtering, a mask made of resist is formed by using a fourth photomask, and then, the metal film is selectively etched to form the wiring 719, the connecting electrode 720, the terminal electrode 751, a source electrode or drain electrode 771 of the TFT 730, and a source electrode or drain electrode 772 of the TFT 731. Then, the mask made of resist is removed. It is to be noted that the metal stacked film according to the present example has a stacked structure of three layers of a Ti film of 100 nm, an Al film containing the small amount of Si of 350 nm, and a Ti film of 100 nm.

In the above-mentioned step, the top gate TFTs 730 and 731 using a polycrystal silicon film can be manufactured.

Figure 14A:
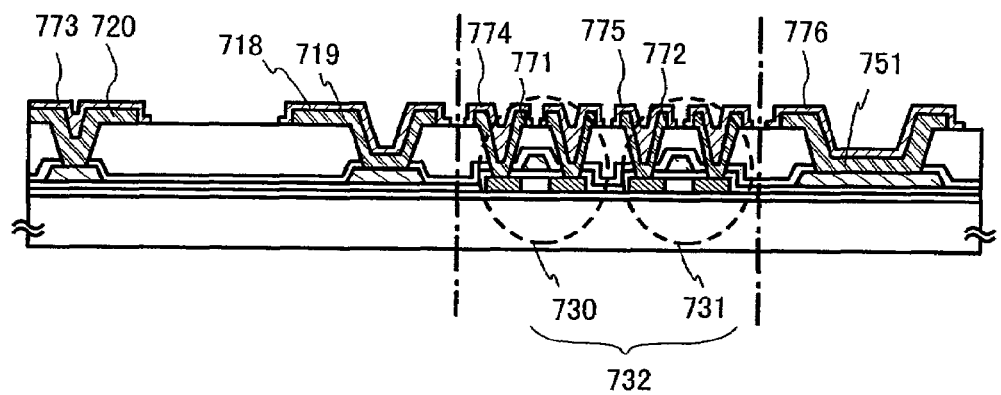
FIGS. 14A to 14C are views illustrating a manufacturing step of a device in which a photo-sensor according to the present invention is mounted.

Then, after a conductive metal film (such as titanium (Ti) or molybdenum (Mo)) is formed, which is not likely to react with a photoelectric conversion layer that is formed later (typically, amorphous silicon) to be an alloy, a mask made of resist is formed by using a fifth photomask, and the conductive metal film is selectively etched to form the protective electrode 718 covering the wiring 719 (FIG. 14A). A Ti film of 200 nm thick obtained by sputtering is used here. Similarly, the connecting electrode 720, the terminal electrode 751, and the source electrode or drain electrode of the TFT are also covered with the conductive metal film. Therefore, the conductive metal film also covers a side face where an Al film which is a second layer in the electrode is exposed, thereby preventing diffusion of an aluminum atom into the photoelectric conversion layer.

Subsequently, the photoelectric conversion layer 721 is formed. The photoelectric conversion layer 721 is formed based on the descriptions of the Embodiment and the Examples 1 to 3.

Figure 14B:
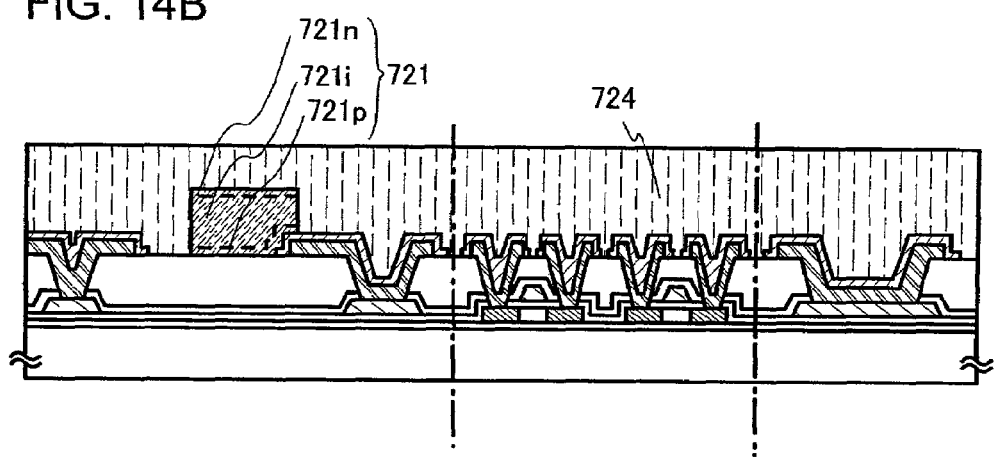

Then, a sealing layer 724 including an insulator material (for example, an inorganic insulating film containing silicon) is formed to have a thickness of 1 μm to 30 μm over the entire surface, and a state of FIG. 14B is obtained. Here, a silicon oxide film containing nitrogen of 1 μm thick is formed by CVD as the insulator material film. It is intended that adhesiveness be improved by using the insulating film formed by CVD.

Next, after the sealing layer 724 is etched to provide an opening, the terminal electrodes 726 and 753 are formed by sputtering. The terminal electrodes 726 and 753 are made of a stacked film of a titanium film (Ti film, 100 Ni), a nickel film (Ni film, 300 nm), and a gold film (Au film, 50 nm). The anchoring intensity of the terminal electrodes 726 and 753 obtained as described above is more than 5N, which is a sufficient anchoring intensity for a terminal electrode.

Figure 14C:
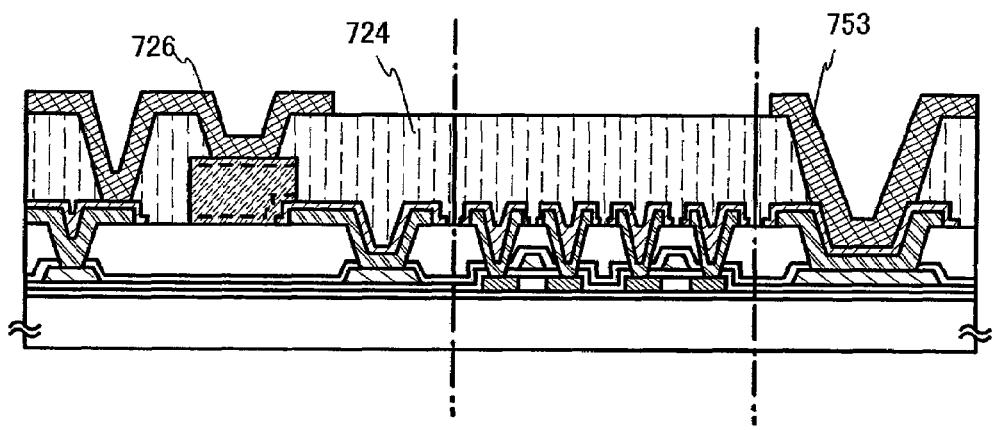

In the above described steps, the terminal electrodes 726 and 753 that can be connected with solder are formed, and a structure shown in FIG. 14C is obtained.

Subsequently, a plurality of photo-sensor chips are cut out by cutting the substrate into pieces. A large number of photo-sensor chips (2 mm×1.5 mm) can be manufactured from one piece of large-area substrate (for example, 600 cm×720 cm).

Figure 15A:
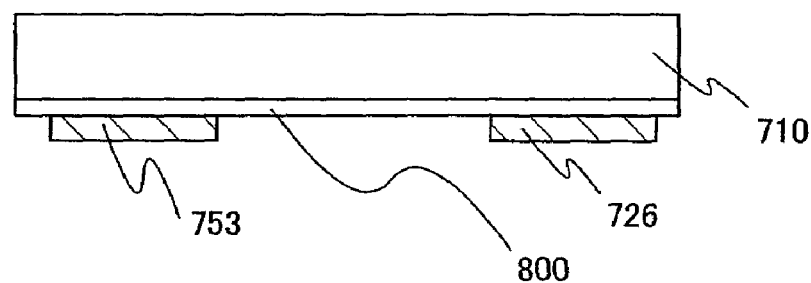
FIGS. 15A to 15C are views illustrating a manufacturing step of a device in which a photo-sensor according to the present invention is mounted.
Figure 15B:
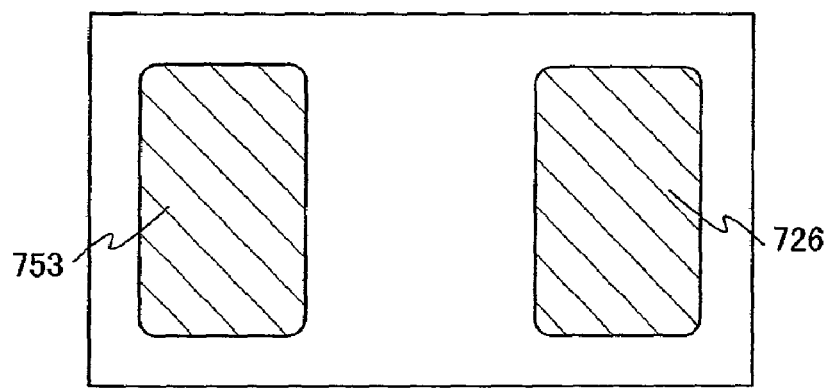
Figure 15C:
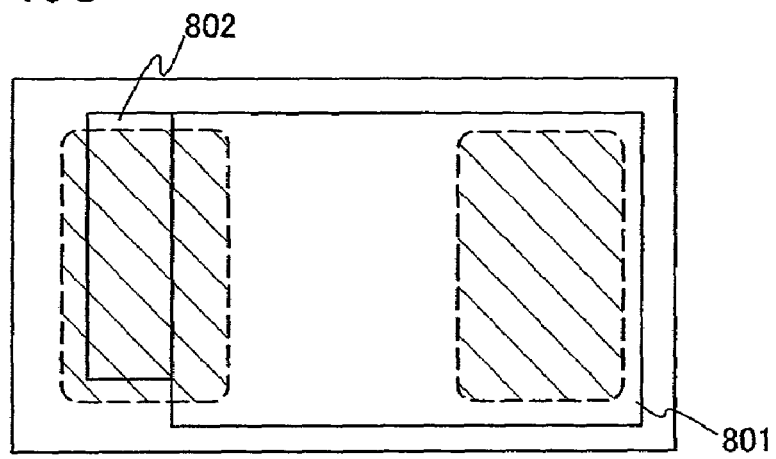

A cross-sectional view (side view) of one piece of photo-sensor chip (2 mm×1.5 mm) that is cut out is shown in FIG. 15A, a bottom view thereof is shown in FIG. 15B, and a top view thereof is shown in FIG. 15C. In FIGS. 15A to 15C, the same reference numerals as in FIGS. 13A and 13B, and 14A to 14C are used for the same portions. It is to be noted that, in FIG. 15A, a film thickness of the substrate 710, an element formation region 800, the terminal electrodes 726 and 753 in total is 0.8±0.05 mm.

In addition, in order to make the total film thickness of the photo-sensor chip thinner, a plurality of photo-sensor chips may be cut out by cutting the substrate into pieces using a dicer after the substrate 710 is ground and thinned by a CMP treatment or the like.

In FIG. 15B, the electrode size of one of the terminal electrodes 726 and 753 is 0.6 mm×1.1 mm, and the electrode interval is 0.4 mm. In addition, in FIG. 15C, the area of a light receiving portion 801 is almost the same as the area of the second electrode, that is, 1.57 mm$^2$. Further, an amplifier circuit portion 802 is provided with approximately 100 TFTs.

Finally, the obtained photo-sensor chip is mounted on the mounting side of the printed wiring board 760. Solder 764 and 763 is used for connecting the terminal electrode 726 to the electrode 761, and the terminal electrode 753 to the electrode 762, respectively. The solder is formed in advance by screen printing or the like over the electrodes 761 and 762 of the printed wiring board 760, and the solder and the terminal electrode are made in an abutted state to conduct mounting by a reflow soldering treatment. The reflow soldering treatment is conducted, for example, at approximately 225° C. to 265° C. for about 10 seconds in an inert gas atmosphere. Further, in addition to the solder, a bump made of a metal (such as gold or silver) or a bump made of a conductive resin or the like can be used. In addition, lead-free solder may also be used for mounting in consideration of an environmental problem.

FIG. 14A shows the photo-sensor chip mounted through the above-described steps. In the photo-sensor according to the present invention (a photo-sensor integrated with a circuit and provided with an amplifier circuit capable of increasing the output value by 100 times), a photoelectric current of approximately 10 μA can be obtained at illuminance of 100 lux. In addition, in the photo-sensor according to the present invention, a sensitivity wavelength range is 350 to 750 nm, and a peak sensitivity wavelength is 580 nm. Further, a dark current (Vr=5V) is 1000 pA.

It is to be noted that the present example can be combined with any descriptions of the Embodiment and the Examples 1 to 3.

EXAMPLE 5

In the present example, examples of a photo-sensor provided with an auxiliary electrode, which are different from the Example 2, will be described with reference to FIGS. 18A and 18B.

Figure 18A:
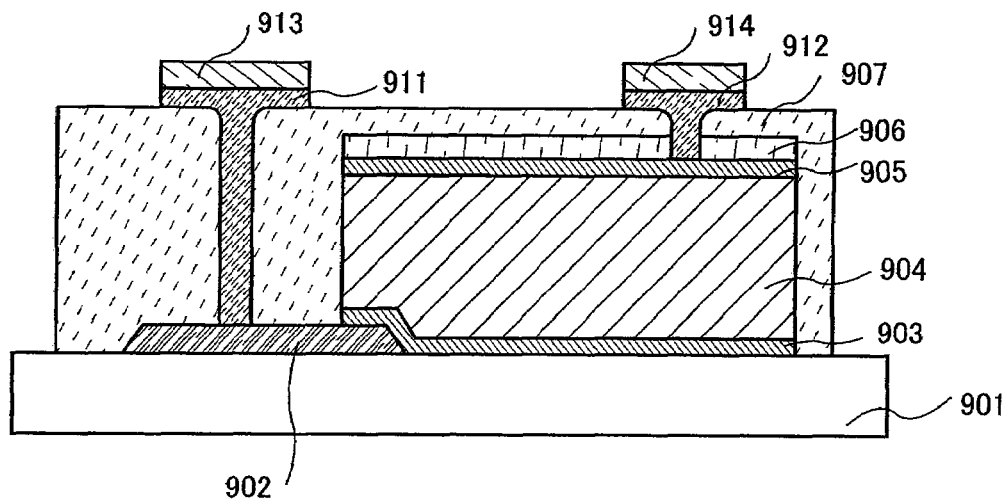
FIGS. 18A and 18B are views illustrating a manufacturing step of a photo-sensor according to the present invention.

A photo-sensor shown in FIG. 18A includes an auxiliary electrode 902, a p-type semiconductor film 903, an intrinsic semiconductor film 904, an n-type semiconductor film 905, a first insulating film 906, a second insulating film 907, electrode layers 911 and 912, and extraction electrodes 913 and 914 over a substrate 901.

Manufacturing steps of the photo-sensor in the present example will be described hereinafter. First, the auxiliary electrode 902 is formed by using a transparent conductive film over the substrate 901. In the present example, an indium oxide-tin oxide alloy containing silicon (Si) (also referred to as indium tin oxide containing Si) is used as the transparent conductive material. In addition to the indium oxide-tin oxide alloy containing Si, zinc oxide (ZnO), tin oxide ($SnO_2$), indium oxide, an indium oxide-zinc oxide alloy formed by using a target in which indium oxide is mixed with 2 to 20 wt % of zinc oxide (ZnO) may also be used.

When an area of a light-receiving region can be kept sufficiently, the auxiliary electrode 902 may be formed by using a conductive film that is not a transparent conductive film, for example, a light shielding conductive film. As such a conductive film, a single-layer film composed of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag) or copper (Cu), or an alloy material or a compound material containing the element as a main component; or a single-layer film composed of nitride thereof such as titanium nitride, tungsten nitride, tantalum nitride or molybdenum nitride may be used.

After the auxiliary electrode 902 is formed, a photoelectric conversion layer including the p-type semiconductor film 903, the intrinsic semiconductor film 904 and the n-type semiconductor film 905 is formed. The photoelectric conversion layer including the p-type semiconductor film 903, the intrinsic semiconductor film 904 and the n-type semiconductor film 905 may have a stacked structure of the reverse order, namely, the n-type semiconductor film, the intrinsic semiconductor film and the p-type semiconductor film are stacked in this order to form a photoelectric conversion layer.

In the present example, for example, a p-type semi-amorphous semiconductor film is formed as the p-type semiconductor film 903. As the p-type semi-amorphous semiconductor film, a semi-amorphous silicon film containing an impurity element that belongs to Group 13 of the periodic table such as boron (B) is formed by plasma CVD.

After the p-type semiconductor film 903 is formed, the semiconductor film (intrinsic semiconductor film) 904 which does not include impurities imparting a conductivity type and the n-type semiconductor film 905 are formed sequentially.

As the intrinsic semiconductor film 904, for example, a semi-amorphous silicon film may be formed by plasma CVD. In addition, as the n-type semiconductor film 905, a semi-amorphous silicon film containing an impurity element that belongs to Group 15 of the periodic table such as phosphorus (P) may be formed, or an impurity element that belongs to Group 15 of the periodic table may be introduced after forming the semi-amorphous silicon film. It is to be noted that the amount of an impurity is controlled so that conductivity of the p-type semi-amorphous semiconductor film 903 and the n-type semi-amorphous semiconductor film 905 is 1 S/cm.

In addition, not only a semi-amorphous semiconductor film but also an amorphous semiconductor film may be used for the p-type semiconductor film 903, the intrinsic semiconductor film 904 and the n-type semiconductor film 905.

Next, the first insulating film 906 is formed over the n-type semiconductor film 905 by screen printing or the like.

Then, the p-type semiconductor film 903, the intrinsic semiconductor film 904, the n-type semiconductor film 905 and the first insulating film 906 are etched to expose a part of the auxiliary electrode 902. In other words, it is a state that the p-type semiconductor film 903, the intrinsic semiconductor film 904, the n-type semiconductor film 905 and the first insulating film 906 are stacked over the other part of the auxiliary electrode 902. The photoelectric conversion layer including the p-type semiconductor film 903, the intrinsic semiconductor film 904 and the n-type semiconductor film 905 overlaps and contacts with the other part of the auxiliary electrode 902. Thereafter, the second insulating film 907 is formed to cover the auxiliary electrode 902, the p-type semiconductor film 903, the intrinsic semiconductor film 904, the n-type semiconductor film 905 and the first insulating film 906.

Subsequently, a contact hole (groove) is formed in the first insulating film 906 and the second insulating film 907, and then, the electrode layers 911 and 912 are formed with a conductive paste by screen printing. As the conductive paste, a conductive paste containing a metal material such as silver (Ag), gold (Au), copper (Cu) or nickel (Ni), or a conductive carbon paste can be used. In addition, the electrode layers 911 and 912 may be formed by ink jet. That is to say, the electrode layer 911 is not connected to the entire surface of the auxiliary electrode 902, but connected in contact with a part of the auxiliary electrode 902. In addition, the electrode layer 912 is not connected to the entire surface of the n-type semiconductor film 905, but connected in contact with a part of the n-type semiconductor film 905.

If necessary, the extraction electrodes 913 and 914 are formed so as to be in contact with the electrode layers 911 and 912 (FIG. 18A). The extraction electrodes 913 and 914 are formed in the same manner as the electrode layers 911 and 912.

Figure 18B:
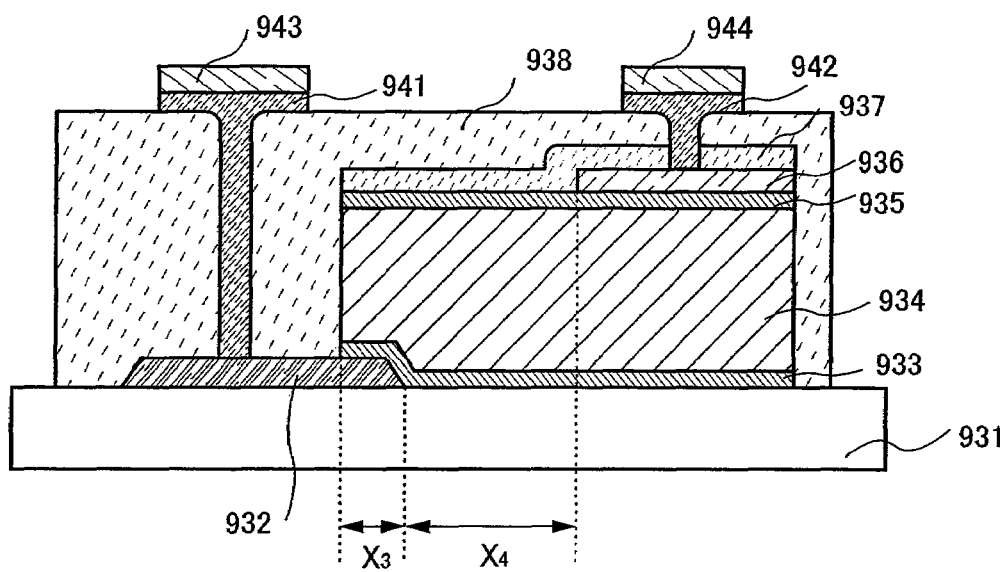

FIG. 18B shows an example of forming an electrode in the upper position of the photoelectric conversion layer of the photo-sensor of FIG. 18A. In FIG. 18B, an auxiliary electrode 932 is formed over a substrate 931, and a photoelectric conversion layer including a p-type semiconductor film 933, an intrinsic semiconductor film 934 and an n-type semiconductor film 935 overlaps and contacts with a part of the auxiliary electrode 932.

Then, an upper electrode 936 is formed over the n-type semiconductor film 935 overlapping with a part of the n-type semiconductor film 935. The upper electrode 936 is formed by the same material as the auxiliary electrode 932.

Further, a first insulating film 937 and a second insulating film 938 are formed, and a contact hole (groove) is formed. Then, electrode layers 941 and 942 are formed. If necessary, extraction electrodes 943 and 944 are formed. The first insulating film 937, the second insulating film 938, the electrode layers 941 and 942, and the extraction electrodes 943 and 944 are formed by the same material and in the same manufacturing step as in FIG. 18A.

When the upper electrode 936 is formed, resistance of a whole photo-sensor is lowered; however, the resistance value of the photo-sensor can be controlled by the distance between the auxiliary electrode 932 and the upper electrode 936.

The length of a region where the auxiliary electrode 932 overlaps with the p-type semiconductor film 933 is referred to as $X_3$ (=100 μm), and the distance between an end portion of the auxiliary electrode 932 and an end portion of the upper electrode 936 is referred to as $X_4$. Withstand voltage (V) and series resistance (Ω) in the case of setting $X_4$ to be 0 μm, 100 μm and 200 μm, respectively, are indicated in the table 1.

TABLE 1

| $X_4$ (μm) | Withstand voltage (V) | Series resistance (Ω) |
|---|---|---|
| 0 | 100~200 | 25k |
| 100 | 500~1000 | 40k |
| 200 | 1000~1500 | 55k |

As indicated in the table 1, even when the resistance value of the photo-sensor is lowered by forming the upper electrode 936, the resistance value of a whole element can be increased by changing the distance between the upper electrode 936 and the auxiliary electrode 932.

It is to be noted that the present example can be combined with any descriptions of the Embodiment and the Examples 1 to 4, if necessary.

EXAMPLE 6

In the present example, as for a photo-sensor for visible light including a wiring or an electrode made of a single-layer conductive film, a different example from the Example 4 will be described with reference to FIG. 21. The same reference numerals are used for the same portions in Example 4.

Figure 21:
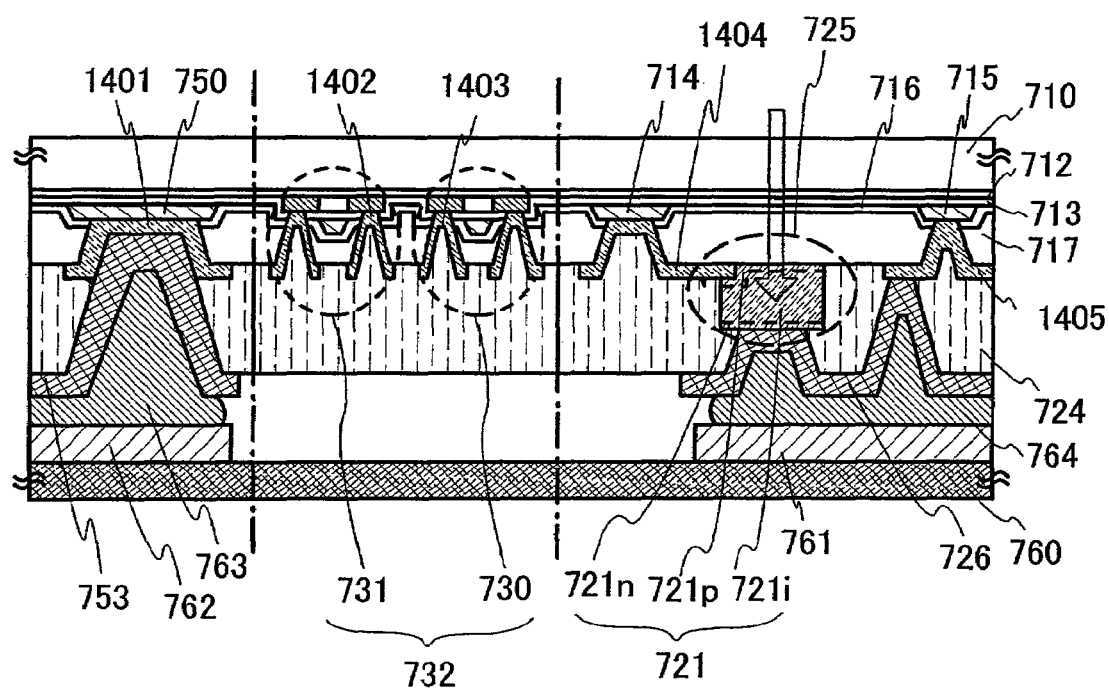
FIG. 21 is a view illustrating a manufacturing step of a device in which a photo-sensor according to the present invention is mounted.

FIG. 21 shows a photo-sensor for visible light having a structure in which the protective electrodes 718, 773, 776, 774 and 775 are not provided over the wiring 719, the connecting electrode 720, the terminal electrode 751, the source electrode or drain electrode 771 of the TFT 730, and the source electrode or drain electrode 772 of the TFT 731 in FIGS. 13A and 13B, 14A and 14B, 15A to 15C, and 20A to 20D.

In FIG. 21, a wiring 1404, a connecting electrode 1405, a terminal electrode 1401, a source electrode or drain electrode 1402 of a TFT 731, a source electrode or drain electrode 1403 of a TFT 730 are formed by using a single-layer conductive film, and as such a conductive film, a titanium film (Ti film) is preferably used. In addition, instead of the titanium film, single-layer film composed of an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), or platinum (Pt), or an alloy material or a compound material containing the element as a main component; or a single-layer film composed of nitride thereof such as titanium nitride, tungsten nitride, tantalum nitride or molybdenum nitride may be used. By forming the wiring 1404, the connecting electrode 1405, the terminal electrode 1401, the source electrode or drain electrode 1402 of the TFT 731, and the source electrode or drain electrode 1403 of the TFT 730 with a single-layer film, the number of deposition can be reduced in manufacturing steps.

It is to be noted that the present example can be combined with any descriptions of the Embodiment and the Examples 1 to 5, if necessary.

In accordance with the present invention, a photoelectric conversion device in which withstand voltage to electrostatic discharge damage is improved can be manufactured. Further, by incorporating the photoelectric conversion device according to the present invention, a high reliable electronic device can be obtained.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A photoelectric conversion device comprising:
   a first electrode over a substrate;
   a photoelectric conversion layer comprising a first semiconductor film having one conductivity type, a second semiconductor film, and a third semiconductor film having an inverse conductivity type to the conductivity type of the first semiconductor film;
   an insulating film covering the first electrode and the photoelectric conversion layer;
   a second electrode over the insulating film, and in contact with a part of the firstelectrode; and
   a third electrode over the insulating film, and in contact with a part of the third semiconductor film,
   wherein the photoelectric conversion layer overlaps and contacts with a part of the first electrode, and
   wherein the second electrode and the third electrode comprise the same material, and are formed in the same layer.

2. The photoelectric conversion device according to claim 1, wherein the first electrode is a transparent electrode.

3. The photoelectric conversion device according to claim 2, wherein the transparent electrode comprises any of an indium oxide-tin oxide alloy containing silicon, zinc oxide, tin oxide, indium oxide, or an indium oxide-zinc oxide alloy formed by using a target in which indium oxide is mixed with 2 wt % or more to 20 wt % or less of zinc oxide.

4. The photoelectric conversion device according to claim 1, wherein the substrate is a flexible substrate.

5. The photoelectric conversion device according to claim 4, wherein the flexible substrate comprises a film selected from the group consisting of a polyethylenenaphthalate (PEN) film, a polyethylene terephthalate (PET) film, and a polybutylene naphthalate (PBN) film.

6. A photoelectric conversion device comprising:
a first electrode over a substrate;
a photoelectric conversion layer comprising a first semiconductor film having one conductivity type, a second semiconductor film, and a third semiconductor film having an inverse conductivity type to the conductivity type of the first semiconductor film;
an insulating film covering the first electrode and the photoelectric conversion layer;
a second electrode over the insulating film, and in contact with a part of the first electrode; and
a third electrode over the insulating film, and in contact with a part of the third semiconductor film,
wherein the photoelectric conversion layer overlaps and contacts with a part of the first electrode,
wherein a width of the photoelectric conversion layer is larger than a width of the part of the first electrode, and
wherein the second electrode and the third electrode comprise the same material, and are formed in the same layer.

7. The photoelectric conversion device according to claim 6, wherein the first electrode is a transparent electrode.

8. The photoelectric conversion device according to claim 7, wherein the transparent electrode comprises any of an indium oxide-tin oxide alloy containing silicon, zinc oxide, tin oxide, indium oxide, or an indium oxide-zinc oxide alloy formed by using a target in which indium oxide is mixed with 2 wt % or more to 20 wt % or less of zinc oxide.

9. The photoelectric conversion device according to claim 6, wherein the substrate is a flexible substrate.

10. The photoelectric conversion device according to claim 9, wherein the flexible substrate comprises a film selected from the group consisting of a polyethylenenaphthalate (PEN) film, a polyethylene terephthalate (PET) film, and a polybutylene naphthalate (PBN) film.

11. A photoelectric conversion device comprising:
a first electrode over a substrate;
a photoelectric conversion layer comprising a first semiconductor film having one conductivity type, a second semiconductor film, and a third semiconductor film having an inverse conductivity type to the conductivity type of the first semiconductor film;
an insulating film covering the first electrode and the photoelectric conversion layer;
a second electrode over the insulating film, and in contact with a part of the first electrode; and
a third electrode over the insulating film, and in contact with a part of the third semiconductor film,
wherein the photoelectric conversion layer overlaps and contacts with a part of the first electrode,
wherein a width of the photoelectric conversion layer is larger than a width of the part of the third semiconductor film, and
wherein the second electrode and the third electrode comprise the same material, and are formed in the same layer.

12. The photoelectric conversion device according to claim 11, wherein the first electrode is a transparent electrode.

13. The photoelectric conversion device according to claim 12, wherein the transparent electrode comprises any of an indium oxide-tin oxide alloy containing silicon, zinc oxide, tin oxide, indium oxide, or an indium oxide-zinc oxide alloy formed by using a target in which indium oxide is mixed with 2 wt % or more to 20 wt % or less of zinc oxide.

14. The photoelectric conversion device according to claim 11, wherein the substrate is a flexible substrate.

15. The photoelectric conversion device according to claim 14, wherein the flexible substrate comprises a film selected from the group consisting of a polyethylenenaphthalate (PEN) film, a polyethylene terephthalate (PET) film, and a polybutylene naphthalate (PBN) film.

16. A photoelectric conversion device comprising:
a first electrode over a substrate;
a photoelectric conversion layer comprising a first semiconductor film having one conductivity type, a second semiconductor film, and a third semiconductor film having an inverse conductivity type to the conductivity type of the first semiconductor film over the first electrode;
an insulating film covering the first electrode and the photoelectric conversion layer;
a second electrode over the insulating film, and in contact with a part of the first electrode; and
a third electrode over the insulating film, and in contact with a part of the third semiconductor film,
wherein the photoelectric conversion layer overlaps and contacts with a part of the first electrode,
wherein the third electrode does not overlap with the first electrode through the photoelectric conversion layer between the first electrode and the third electrode, and
wherein the second electrode and the third electrode comprise the same material, and are formed in the same layer.

17. The photoelectric conversion device according to claim 16, wherein the first electrode is a transparent electrode.

18. The photoelectric conversion device according to claim 17, wherein the transparent electrode comprises any of an indium oxide-tin oxide alloy containing silicon, zinc oxide, tin oxide, indium oxide, or an indium oxide-zinc oxide alloy formed by using a target in which indium oxide is mixed with 2 wt % or more to 20 wt % or less of zinc oxide.

19. The photoelectric conversion device according to claim 16, wherein the substrate is a flexible substrate.

20. The photoelectric conversion device according to claim 19, wherein the flexible substrate comprises a film selected from the group consisting of a polyethylenenaphthalate (PEN) film, a polyethylene terephthalate (PET) film, and a polybutyle nenaphthalate (PBN) film.

21. A photoelectric conversion device comprising:
a first electrode over an insulating surface;
a photoelectric conversion layer comprising a first semiconductor film having one conductivity type, a second semiconductor film, and a third semiconductor film having an inverse conductivity type to the conductivity type of the first semiconductor film over the first electrode;
an insulating film covering the first electrode and the photoelectric conversion layer;
a second electrode over the insulating film, and in contact with a part of the first electrode; and
a third electrode over the insulating film, and in contact with a part of the third semiconductor film,
wherein the photoelectric conversion layer overlaps and contacts with a part of the first electrode,
wherein the photoelectric conversion layer is in contact with the insulating surface, and
wherein the second electrode and the third electrode comprise the same material, and are formed in the same layer.

22. The photoelectric conversion device according to claim 21, wherein the first electrode is a transparent electrode.

23. The photoelectric conversion device according to claim 22, wherein the transparent electrode comprises any of an indium oxide-tin oxide alloy containing silicon, zinc oxide, tin oxide, indium oxide, or an indium oxide-zinc oxide alloy formed by using a target in which indium oxide is mixed with 2 wt % or more to 20 wt % or less of zinc oxide.

* * * * *